(12) United States Patent
An et al.

(10) Patent No.: US 11,715,418 B2
(45) Date of Patent: Aug. 1, 2023

(54) DISPLAY APPARATUS

(71) Applicant: Samsung Display Co., Ltd., Yongin-si (KR)

(72) Inventors: Junyong An, Yongin-si (KR); Wonkyu Kwak, Yongin-si (KR); Changsoo Pyon, Yongin-si (KR); Minjeong Kim, Yongin-si (KR); Hyungjun Park, Yongin-si (KR); Nuree Um, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 229 days.

(21) Appl. No.: 17/140,677

(22) Filed: Jan. 4, 2021

(65) Prior Publication Data

US 2021/0359066 A1 Nov. 18, 2021

(30) Foreign Application Priority Data

May 15, 2020 (KR) .......................... 10-2020-0058447

(51) Int. Cl.
*G09G 3/3233* (2016.01)
*H01L 29/786* (2006.01)
(Continued)

(52) U.S. Cl.
CPC ......... *G09G 3/3233* (2013.01); *G09G 3/3208* (2013.01); *H01L 29/7869* (2013.01);
(Continued)

(58) Field of Classification Search
CPC ............... H10K 59/126; H10K 59/131; H01L 29/78651; H01L 29/7869; H01L 29/78693;
(Continued)

(56) References Cited

U.S. PATENT DOCUMENTS 7,616,178 B2 11/2009 You et al.
9,599,867 B2 3/2017 Kang et al.
(Continued)

FOREIGN PATENT DOCUMENTS

KR 10-1066414 9/2011
KR 10-2015-0132610 11/2015
(Continued)

*Primary Examiner* — Jose R Diaz
(74) *Attorney, Agent, or Firm* — Kile Park Reed & Houtteman PLLC

(57) ABSTRACT

A display apparatus includes a substrate including a display area including a display element, a first thin film transistor disposed in the display area, the first thin film transistor including a first semiconductor layer including a silicon semiconductor and a first gate electrode insulated from the first semiconductor layer, a second thin film transistor disposed in the display area, the second thin film transistor including a second semiconductor layer including an oxide semiconductor and a second gate electrode insulated from the second semiconductor layer, a first signal line extending at a side of the first thin film transistor in a first direction, a second signal line extending at an opposite side of the first thin film transistor in the first direction, and a shielding pattern extending in the first direction, the shielding pattern at least partially overlapping the first signal line.

20 Claims, 17 Drawing Sheets

(51) Int. Cl.
  *G09G 3/3208* (2016.01)
  *H10K 59/126* (2023.01)
  *H10K 59/131* (2023.01)

(52) U.S. Cl.
  CPC ..... *H01L 29/78651* (2013.01); *H10K 59/126* (2023.02); *H10K 59/131* (2023.02)

(58) Field of Classification Search
  CPC ........... H01L 29/78633; H01L 27/1255; H01L 23/522
  See application file for complete search history.

(56) References Cited

U.S. PATENT DOCUMENTS

| | | | |
|---|---|---|---|
| 10,263,060 | B2 | 4/2019 | Noh et al. |
| 10,504,403 | B2 | 12/2019 | Park |
| 11,387,312 | B2 * | 7/2022 | Cho .................... H01L 27/1225 |
| 11,581,392 | B2 * | 2/2023 | Lee ...................... G09G 3/3233 |
| 2019/0189722 | A1 * | 6/2019 | Lim ................... H10K 59/1216 |
| 2019/0385522 | A1 | 12/2019 | Song et al. |
| 2020/0227494 | A1 * | 7/2020 | Bae ....................... H10K 59/123 |
| 2021/0104591 | A1 * | 4/2021 | Lim ................... H10K 59/1216 |
| 2021/0288078 | A1 * | 9/2021 | Suzumura ......... H01L 29/78633 |

FOREIGN PATENT DOCUMENTS

| | | |
|---|---|---|
| KR | 10-2016-0009516 | 1/2016 |
| KR | 10-2018-0012442 | 2/2018 |
| KR | 10-2019-0143549 | 12/2019 |

\* cited by examiner

DISPLAY APPARATUS

CROSS-REFERENCE TO RELATED APPLICATION(S)

This application claims priority to and benefits of Korean Patent Application No. 10-2020-0058447 under 35 U.S.C. § 119, filed on May 15, 2020, in the Korean Intellectual Property Office, the entire contents of which are incorporated herein by reference.

BACKGROUND

1. Technical Field

One or more embodiments relate to a display apparatus, and, to a display apparatus driven by a thin film transistor including a silicon semiconductor and a thin film transistor including an oxide semiconductor.

2. Description of the Related Art

A display apparatus may generally include a display element and a driving circuit for controlling an electrical signal applied to the display element. A driving circuit may include a thin film transistor (TFT), a storage capacitor, and wires.

In order to accurately control light emission and a degree of light emission from the display element, the number of TFTs electrically connected to one display element has increased. Accordingly, research has been actively performed regarding a high integration and power consumption of the display apparatus.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus which may be driven by a thin film transistor including a silicon semiconductor and a thin film transistor including an oxide semiconductor to reduce power consumption and to achieve high integration.

However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a substrate including a display area including a display element; a first thin film transistor disposed in the display area, wherein the first thin film transistor may include a first semiconductor layer including a silicon semiconductor; and a first gate electrode insulated from the first semiconductor layer; a second thin film transistor disposed in the display area, wherein the second thin film transistor may include a second semiconductor layer including an oxide semiconductor; and a second gate electrode insulated from the second semiconductor layer; a first signal line extending at a side of the first thin film transistor in a first direction; a second signal line extending at an opposite side of the first thin film transistor in the first direction; and a shielding pattern extending in the first direction, the shielding pattern at least partially overlapping the first signal line The shielding pattern and the first semiconductor layer may be disposed on a same layer.

The first thin film transistor may include a driving transistor and an emission control transistor, the second thin film transistor may include a compensation transistor, the first signal line may be electrically connected to a gate electrode of the compensation transistor to transfer a scan signal, and the second signal line may be electrically connected to a gate electrode of the emission control transistor to transfer an emission control signal.

The first thin film transistor may include a driving transistor and a switching transistor, a semiconductor layer in the driving transistor and a semiconductor layer in the switching transistor may be integral with each other, and the shielding pattern may protrude from a region between a semiconductor layer of the driving transistor and a semiconductor layer of the switching transistor in the first direction in a plan view.

The second thin film transistor may include a compensation transistor, and the shielding pattern may overlap a semiconductor layer of the compensation transistor of the second thin film transistor.

The shielding pattern may receive a positive voltage during an emission period of the display element.

The shielding pattern may be disposed between the substrate and the first semiconductor layer of the first thin film transistor.

The first thin film transistor may include a driving transistor and an emission control transistor, the second thin film transistor may include a compensation transistor, and the first signal line may include an emission control line that may be electrically connected to a gate electrode of the emission control transistor to transfer an emission control signal The display apparatus may further include a first interlayer insulating layer disposed between the first gate electrode and the second thin film transistor; a second interlayer insulating layer overlapping the second gate electrode of the second thin film transistor; a first power voltage line disposed on the second interlayer insulating layer, the first power voltage line extending in a second direction intersecting the first direction; a first planarization layer overlapping the first power voltage line; and a data line disposed on the first planarization layer, the data line extending in the second direction and at least partially overlapping the first power voltage line.

The display apparatus may further include a node connecting line disposed on the second interlayer insulating layer, wherein the node connecting line may include an end electrically connected to the first gate electrode of the first thin film transistor; and an opposite end electrically connected to the second semiconductor layer of the second thin film transistor.

According to one or more embodiments, a display apparatus may include a substrate including a display area including a display element; a driving transistor, a switching transistor, and an emission control transistor disposed in the display area, wherein the driving transistor, the switching transistor, and the emission control transistor each may include a silicon semiconductor; a compensation transistor disposed in the display area, wherein the compensation transistor may include an oxide semiconductor; a first signal line extending at a side of the driving transistor in a first direction; a second signal line extending at an opposite side of the driving transistor in the first direction; and a shielding pattern extending in the first direction, the shielding pattern at least partially overlapping the first signal line.

The shielding pattern and a semiconductor layer of the driving transistor may be disposed on a same layer.

The first signal line may be electrically connected to a gate electrode of the compensation transistor to transfer a scan signal, and the second signal line may be electrically connected to a gate electrode of the emission control transistor to transfer an emission control signal.

A semiconductor layer of the driving transistor and a semiconductor layer of the switching transistor may be integral with each other, and the shielding pattern may protrude from a region between the semiconductor layer of the driving transistor and the semiconductor layer of the switching transistor in the first direction in a plan view.

The shielding pattern may overlap a semiconductor layer of the compensation transistor.

The compensation transistor may include an NMOS transistor, the emission control transistor may include a PMOS transistor, and the shielding pattern may receive a positive voltage during an emission period of the display element.

The shielding pattern may be disposed between the substrate and the semiconductor layer of the driving transistor.

The first signal line may include an emission control line that may be electrically connected to a gate electrode of the emission control transistor to transfer an emission control signal.

The display apparatus may further include a first power voltage line extending in a second direction intersecting the first direction; a first planarization layer overlapping the first power voltage line; and a data line disposed on the first planarization layer, the data line extending in the second direction and at least partially overlapping the first power voltage line.

The display apparatus may further include a second power voltage line disposed on the first planarization layer and electrically connected to the first power voltage line.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
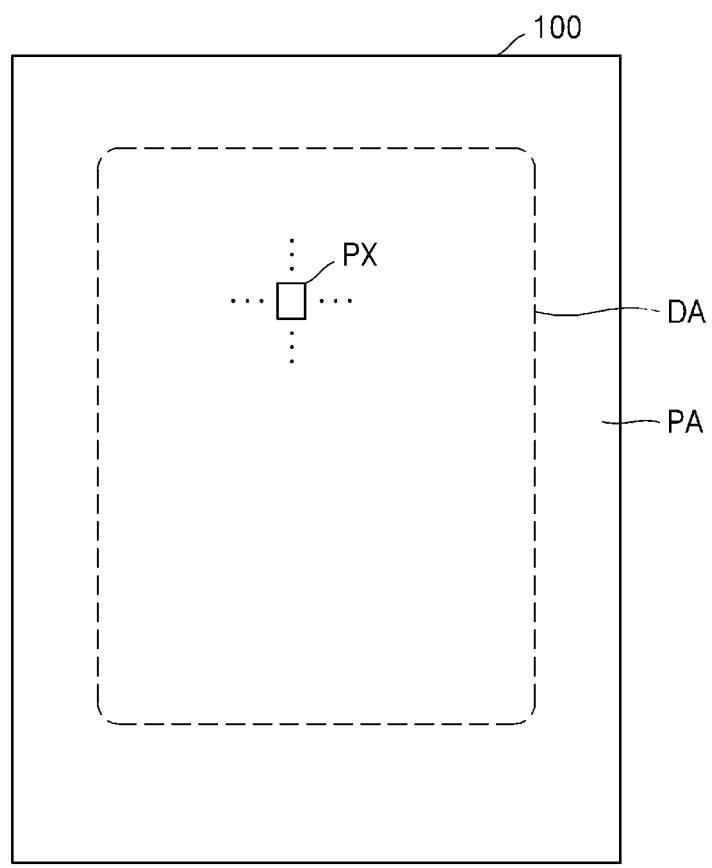
FIG. 1 is a diagram of a display apparatus according to an embodiment.
Figure 1:
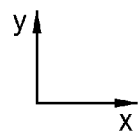

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

While such terms as "first," "second," etc., may be used to describe various components, such components are not be limited to the above terms. The above terms are used only to distinguish one component from another. For example, a first element referred to as a first element in one embodiment may be referred to as a second element in another embodiment without departing from the scope of the appended claims.

An expression used in the singular encompasses the expression of the plural, unless it has a clearly different meaning in the context.

In the specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. For example, intervening layers, regions, or components may be present.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Sizes of components in the drawings may be exaggerated for convenience of explanation. In other words, since sizes and thicknesses of components in the drawings are arbitrarily illustrated for convenience of explanation, the following embodiments are not limited thereto.

In the specification, the phrase "A and/or B" denotes A, B, or A and B. In addition, the phrase "at least one of A and B" denotes A, B, or A and B.

In the specification herein, a line "extending in a first direction or a second direction" denotes extending in the first direction or the second direction in zig-zags or in a curve, as well as extending straightly in the first direction or the second direction.

Throughout the specification, the phrase "in a plan view" denotes viewing a target portion from the top, and the phrase "in a schematic cross-sectional view" denotes viewing of a cross-section of the target portion that is vertically cut from a lateral direction.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a diagram of a display apparatus according to an embodiment.

A display apparatus according to one or more embodiments may be implemented as an electronic device such as a smartphone, a mobile phone, a navigation device, a game console, a TV, a vehicle head unit, a notebook computer, a laptop computer, a tablet computer, a personal media player (PMP), or a personal digital assistant (PDA), for example. Also, the electronic device may be a flexible, bendable, foldable or rollable device.

A substrate 100 may be partitioned into a display area DA displaying images, and a peripheral area PA arranged or disposed around or adjacent to the display area DA.

The substrate 100 may include various materials such as glass, metal, plastic, for example. In an embodiment, the substrate 100 may include a flexible material. Here, the substrate 100 including the flexible material denotes a substrate that may be bendable, foldable, or rollable. The substrate 100 including the flexible material may include ultra-thin glass, metal, or plastic, however, the disclosure is not limited thereto.

Pixels PX each including various display elements such as an organic light-emitting diode OLED may be disposed in the display area DA of the substrate 100. There may be pixels PX, and the pixels PX may be arranged or disposed in various types such as a stripe arrangement, a Pentile arrangement, or a mosaic arrangement, for example to display images.

In a case that the display area DA is seen in a plan view, the display area DA may have a substantially rectangular shape as shown in FIG. 1. In an embodiment, the display area DA may have a substantially polygonal shape such as a triangular shape, a pentagonal shape, a hexagonal shape, for example, a substantially circular shape, a substantially elliptical shape, or an irregular shape, for example.

The peripheral area PA of the substrate 100 may be disposed around or may be adjacent to the display area DA, and may not display images. Various wires for transferring electrical signals that may be applied to the display area DA, and pads to which a driver IC chip or a printed circuit board may be attached may be located or disposed in the peripheral area PA.

Hereinafter, a display apparatus including an organic light-emitting diode as a display element will be described for convenience of description. However, one or more embodiments may be applied to various types of display apparatuses such as a liquid crystal display apparatus, an electrophoretic display apparatus, an inorganic EL display apparatus, for example.

Figure 2:
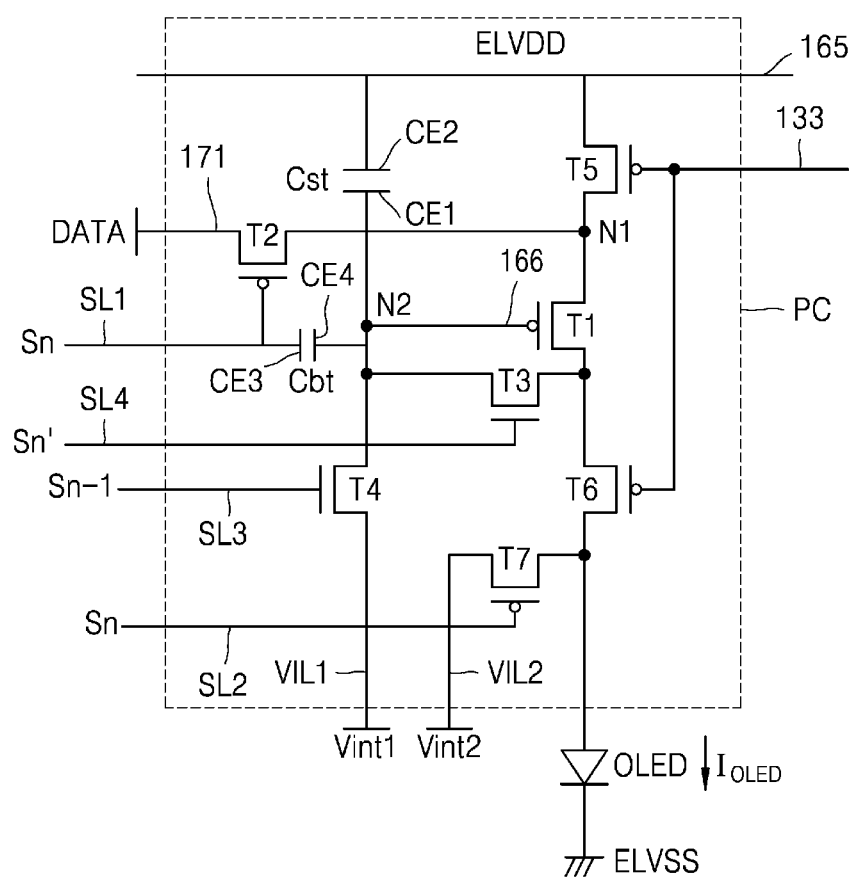
FIG. 2 is an equivalent circuit diagram of a pixel according to an embodiment.

FIG. 2 is an equivalent circuit diagram showing a pixel circuit PC driving a pixel and an organic light-emitting diode as a display element electrically connected to the pixel circuit PC, according to an embodiment.

Referring to FIG. 2, the pixel circuit PC may include first to seventh transistors T1, T2, T3, T4, T5, T6, and T7, a first capacitor Cst, and a second capacitor Cbt. Also, the pixel circuit PC may be electrically connected to signal lines, first and second initialization voltage lines VIL1 and VIL2, and a power voltage line PL. The signal lines may include a data line DL, a first scan line SL1, a second scan line SL2, a third scan line SL3, a fourth scan line SL4, and an emission control line EL. In an embodiment, at least one of the signal lines, the first and second initialization voltage lines VIL1 and VIL2, and/or the power voltage line PL may be shared by adjacent pixel circuits.

The power voltage line PL may transfer a first power voltage ELVDD to the first transistor T1. The first initialization voltage line VIL1 may transfer a first initialization voltage Vint1 for initializing the first transistor T1 to the pixel circuit PC. The second initialization voltage line VIL2 may transfer a second initialization voltage Vint2 for initializing an organic light-emitting diode OLED to the pixel circuit PC.

The first scan line SL1, the second scan line SL2, the third scan line SL3, the fourth scan line SL4, the emission control line EL, and the first and second initialization voltage lines VIL1 and VIL2 may extend in a first direction (x), and may be arranged or disposed apart from one another in respective rows. The data line DL and the power voltage line PL may extend in a second direction (y) and may be spaced apart from each other in each column.

In FIG. 2, the third transistor T3 and the fourth transistor T4, from among the first to seventh transistors T1 to T7, may be implemented as n-channel MOSFET (NMOS) transistors, and the other transistors may be implemented as p-channel MOSFET (PMOS) transistors.

The first transistor T1 may be electrically connected to the power voltage line PL via the fifth transistor T5 and may be electrically connected to the organic light-emitting diode OLED via the sixth transistor T6. The first transistor T1 may act as a driving transistor and receive the data signal DATA to supply a driving current $I_{OLED}$ to the organic light-emitting diode OLED according to a switching operation of the second transistor T2.

The second transistor T2 may be a switching transistor which may be electrically connected to the first scan line SL1 and the data line DL, and may be electrically connected to the power voltage line PL via the fifth transistor T5. The second transistor T2 may be turned on according to a first scan signal Sn transferred through the first scan line SL1 to perform a switching operation for transferring a data signal DATA transferred through the data line DL to a node N1.

The third transistor T3 may be a compensation transistor that may be electrically connected to the fourth scan line SL4 and may be electrically connected to the organic light-emitting diode OLED via the sixth transistor T6. The third transistor T3 may be turned on according to a fourth scan signal Sn' transferred through the fourth scan line SL4 to diode-connect the first transistor T1.

The fourth transistor T4 may be a first initialization transistor that may be electrically connected to the third scan line SL3, that is, a previous scan line, and the first initialization voltage line VIL1, and may be turned on according to a third scan signal Sn−1, that is, a previous scan signal, transferred through the third scan line SL3. Thus, the fourth transistor T4 may transfer the first initialization voltage Vint1 from the first initialization voltage line VIL1 to a gate electrode of the first transistor T1 to initialize a voltage at the gate electrode of the first transistor T1.

The fifth transistor T5 may be an operation control transistor, and a sixth transistor T6 may be an emission control transistor. The fifth transistor T5 and the sixth transistor T6 may be electrically connected to the emission control line EL and may be simultaneously turned on according to an emission control signal En transferred through the emission control line EL to form a current path such that the driving current $I_{OLED}$ may flow from the power voltage line PL towards the organic light-emitting diode OLED.

The seventh transistor T7 may be a second initialization transistor and may be electrically connected to the second scan line SL2, that is, a next scan line, and the second initialization voltage line VIL2. The seventh transistor T7 may be turned on according to a second scan signal GP2 that is a next scan signal transferred through the second scan line SL2, and may transfer the second initialization voltage Vint2 from the second initialization voltage line VIL2 to the organic light-emitting diode OLED and to initialize the organic light-emitting diode OLED. The seventh transistor T7 may be omitted.

The first capacitor Cst may include a first electrode CE1 and a second electrode CE2. The first electrode CE1 may be electrically connected to the gate electrode of the first transistor T1, and the second electrode CE2 may be electrically connected to the power voltage line PL. The first capacitor Cst may store and maintain a voltage corresponding to a difference between a voltage of the power voltage line PL and a voltage of the gate electrode to maintain the voltage applied to the gate electrode of the first transistor T1.

The second capacitor Cbt may include a third electrode CE3 and a fourth electrode CE4. The third electrode CE3 may be electrically connected to the first scan line SL1 and a gate electrode of the second transistor T2. The fourth electrode CE4 may be electrically connected to the gate electrode of the first transistor T1 and the first electrode CE1 of the first capacitor Cst. The second capacitor Cbt may be a boosting capacitor that may increase a voltage at a node N2 to reduce a voltage (black voltage) representing black, in a case that the first scan signal Sn of the first scan line SL1 is a voltage for turning off the second transistor T2.

The organic light-emitting diode OLED may include a pixel electrode and an opposite electrode, and the opposite electrode may receive a second power voltage ELVSS. The organic light-emitting diode OLED may receive the driving current $I_{OLED}$ from the first transistor T1 to emit light, and thus may display images.

Detailed operations of the pixel circuit PC according to an embodiment will be described below.

During a first initialization period, in a case that a third scan signal Sn−1 is supplied through the third scan line SL3, the fourth transistor T4 may be turned on in response to the third scan signal Sn-1, and the first transistor T1 may be initialized by the first initialization voltage Vint1 supplied from the first initialization voltage line VIL1.

During a data programming period, in a case that the first scan signal Sn and the fourth scan signal Sn' are supplied through the first scan line SL1 and the fourth scan line SL4, the second transistor T2 and the third transistor T3 may be turned on in response to the first scan signal Sn and the fourth scan signal Sn'. Here, the first transistor T1 may be diode-connected by the third transistor T3 that may be turned on, and may be biased in a forward direction. Then, in the data signal DATA supplied from the data line DL, a voltage that may be compensated for a threshold voltage Vth of the first transistor T1 may be applied to the gate electrode of the first transistor T1. The first power voltage ELVDD and a compensation voltage may be applied to opposite ends of the first capacitor Cst, and the first capacitor Cst may store an electric charge corresponding to a difference between voltages at opposite ends thereof.

During an emission period, the fifth transistor T5 and the sixth transistor T6 may be turned on according to the emission control signal En supplied from the emission control line EL. The driving current $I_{OLED}$ may be generated according to a difference between the voltage of the gate electrode in the first transistor T1 and the first power voltage ELVDD, and the driving current $I_{OLED}$ may be supplied to the organic light-emitting diode OLED via the sixth transistor T6.

During the second initialization period, in a case that a second scan signal GP2 is supplied through the second scan line SL2, the seventh transistor T7 may be turned on in response to the second scan signal GP2, and the organic light-emitting diode OLED may be initialized by the second initialization voltage Vint2 supplied from the second initialization voltage line VIL2.

In the embodiment, at least one of the first to seventh transistors T1 to T7 may include a semiconductor layer including an oxide material, and the others include a semiconductor layer including silicon. In detail, the first transistor that directly affects a brightness of the display apparatus may include a semiconductor layer including polycrystalline silicon having high reliability, and as such, the display apparatus having high resolution may be implemented.

Oxide semiconductor have a high carrier mobility and a low leakage current, and thus, a voltage drop may not be large even in a case that a driving time may be increased. Because there may be a small color change in the image due to the voltage drop even in a low frequency driving, a low frequency driving of the oxide semiconductor may be possible. As described above, because the oxide semiconductor has a low leakage current, at least one of the third transistor T3 and the fourth transistor T4 electrically connected to the gate electrode of the first transistor T1 may adopt the oxide semiconductor to prevent the leakage current from flowing to the gate electrode of the first transistor T1 and, at the same time, to reduce the power consumption.

Figure 3:
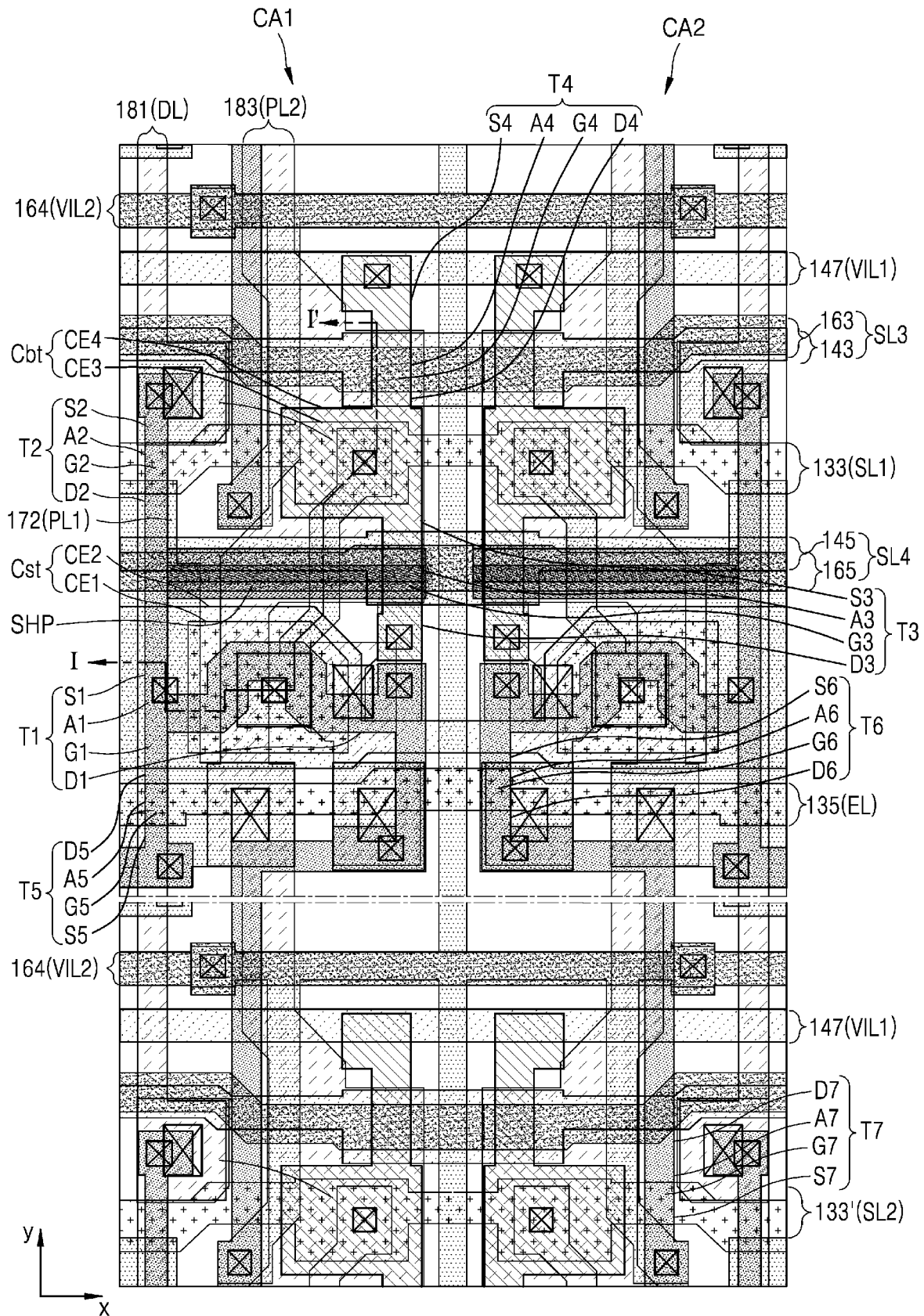
FIG. 3 is a layout showing locations of thin film transistors and capacitors in a pair of pixel circuits of a display apparatus according to an embodiment.
Figure 4:
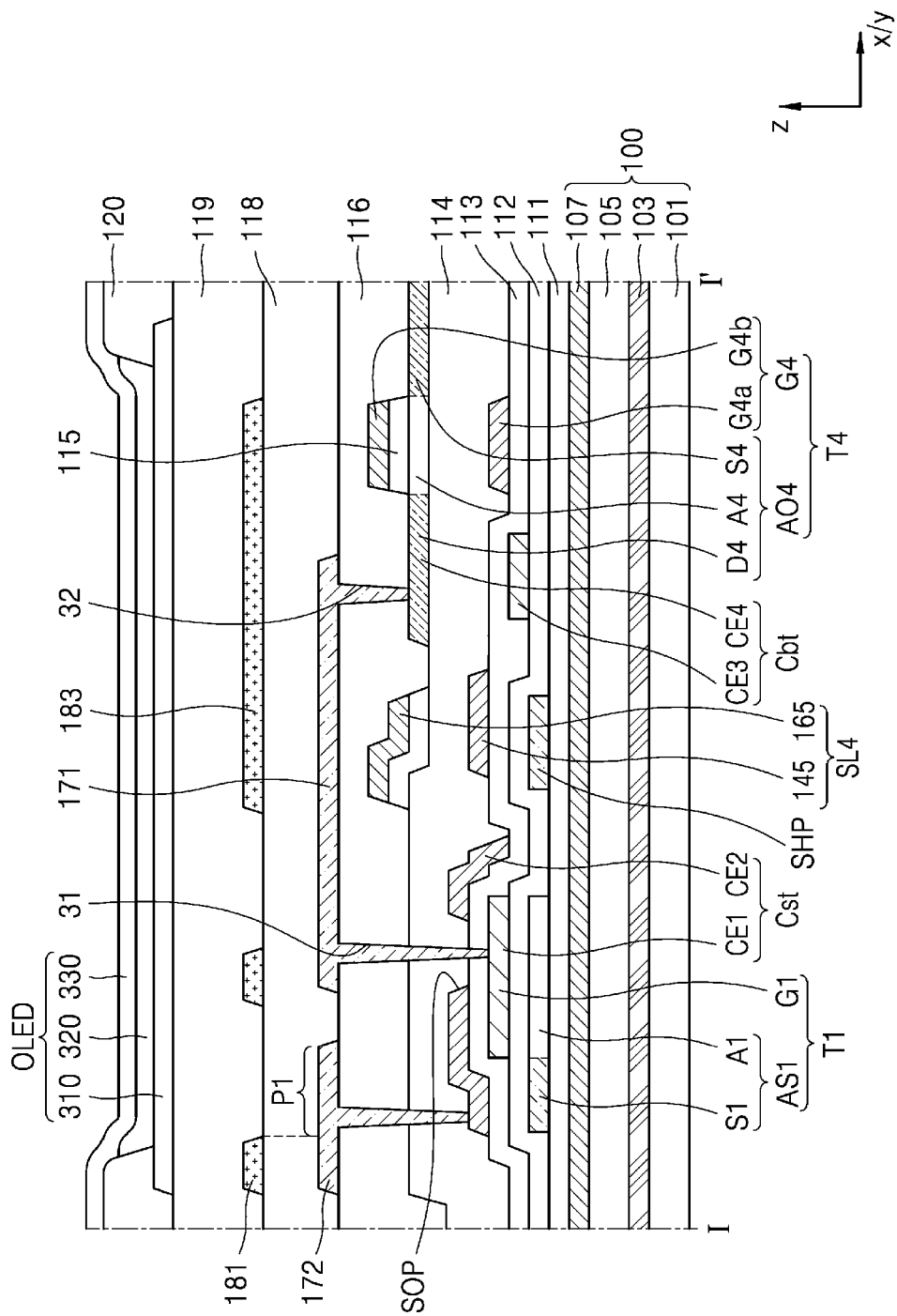
FIG. 4 is a schematic cross-sectional view of the display apparatus taken along line I-I' of FIG. 3.
Figure 5:
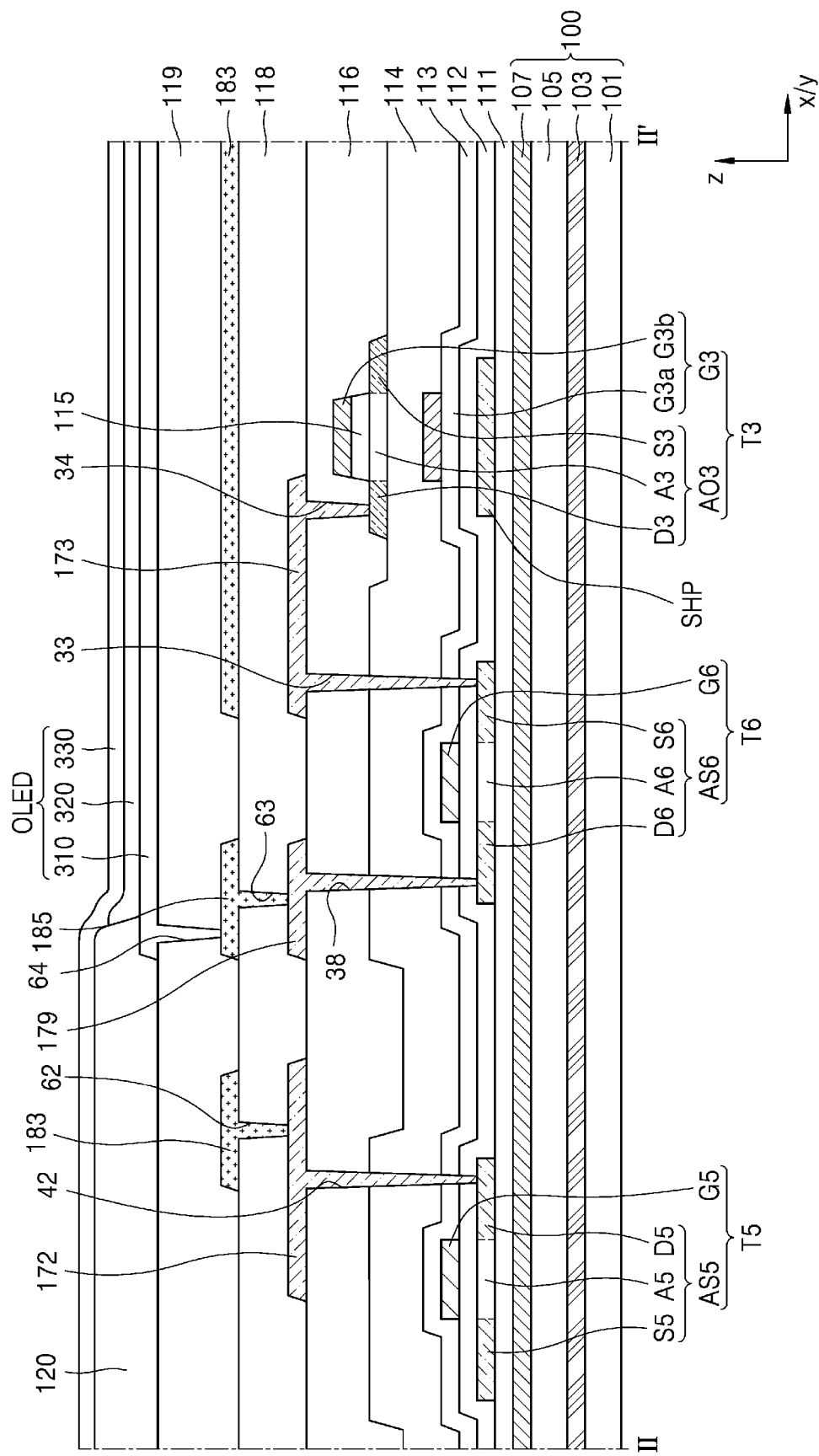
FIG. 5 is a schematic cross-sectional view of the display apparatus taken along line II-II' of FIG. 3.

FIG. 3 is a layout showing locations of thin film transistors and capacitors in a pair of pixel circuits of a display apparatus according to an embodiment. FIG. 4 is a schematic cross-sectional view of the display apparatus taken along line I-I' of FIG. 3, and FIG. 5 is a schematic cross-sectional view of the display apparatus taken along line II-II' of FIG. 3. FIGS. 6A to 6G are layouts showing elements of FIG. 3 according to layers.

FIG. 3 shows a pair of pixel circuits PC arranged or disposed in the same row and adjacent columns. In FIG. 3, a pixel circuit of a pixel in a left pixel area CA1 and a pixel circuit of a pixel in a right pixel area CA2 may have a symmetrical structure.

Referring to FIG. 3, the pixel circuit of the display apparatus according to an embodiment may include a first scan line 133, a second scan line 133', the third scan line SL3, the fourth scan line SL4, an emission control line 135, and an initialization voltage line extending in the first direction (x), and a data line 181 and first and second power voltage lines 172 and 183 extending in the second direction (y) that crosses or intersects the first direction (x). The initialization voltage line may include a first initialization voltage line 147 and a second initialization voltage line 164.

Also, the pixel circuit may include the first transistor T1, the second transistor T2, the third transistor T3, the fourth transistor T4, the fifth transistor T5, the sixth transistor T6, the seventh transistor T7, the first capacitor Cst, and the second capacitor Cbt.

In an embodiment, the first transistor T1, the second transistor T2, the fifth transistor T5, the sixth transistor T6, and the seventh transistor T7 may be provided as thin film transistors each including a silicon semiconductor. The third transistor T3 and the fourth transistor T4 may be provided as thin film transistors each including an oxide semiconductor.

The second scan line 133' may be the first scan line SL1 of a next row. The first scan line 133 of FIG. 3 may be the second scan line SL2 of a previous row. In FIG. 3, the seventh transistor T7 that may be electrically connected to the pixel of the previous row and arranged or disposed in a pixel area of the current row and the seventh transistor T7 that may be electrically connected to the pixel of the current row and arranged or disposed in a pixel area of a next row are both shown. Hereinafter, the seventh transistor T7 arranged or disposed in the pixel area of the current row will be described as an example for convenience of description.

Semiconductor layers in the first transistor T1, the second transistor T2, the fifth transistor T5, the sixth transistor T6, and the seventh transistor T7 may be disposed at the same layer and may include the same or similar material. For example, the semiconductor layers may include polycrystalline silicon. The semiconductor layers of the first transistor T1, the second transistor T2, the fifth transistor T5, the sixth transistor T6, and the seventh transistor T7 may be electrically connected to one another and may be curved in various shapes.

The semiconductor layers in the first transistor T1, the second transistor T2, the fifth transistor T5, the sixth transistor T6, and the seventh transistor T7 may each include a channel region, and a source region and a drain region at opposite sides of the channel region. In an example, the source region and the drain region may be doped with impurities, and the impurities may include N-type impurities or P-type impurities. The source region and the drain region may respectively correspond to a source electrode and a drain electrode. The source region and the drain region may be exchanged with each other according to properties of the transistor. Hereinafter, terms such as the source region and the drain region rather than the source electrode and the drain electrode will be used for the sake of convenience.

The first transistor T1 may include a first semiconductor layer and a first gate electrode G1. The first semiconductor layer may include a first channel region A1, and a first source region S1 and a first drain region D1 at opposite sides of the first channel region A1. The first semiconductor layer may have a substantially curved shape, and accordingly the first channel region A1 may be longer than remaining channel regions A2 to A7. For example, in a case that the first semiconductor layer may be bent a plurality of times such as in 'ᄃ,' 'ᄅ,' 'S,' 'M,' 'W,' for example, a long channel length may be ensured in a narrow space. Because the first channel region A1 may be long, a driving range of a gate voltage applied to the first gate electrode G1 may be increased, and then, the grayscale of the light emitted from the organic light-emitting diode OLED may be precisely controlled and the display quality may be improved. In an embodiment, the first semiconductor layer may have a straight shape, not a bent shape. The first gate electrode G1 may be of an island type, which may overlap the first channel region A1 with the first gate insulating layer 112 (see FIG. 4) disposed therebetween.

The first capacitor Cst may overlap the first transistor T1. The first capacitor Cst may include the first electrode CE1 and the second electrode CE2. The first gate electrode G1 may not only function as a control electrode of the first transistor, but may also function as the first electrode CE1 of the first capacitor Cst. The first gate electrode G1 and the first electrode CE1 may be integrally provided or may be integral with each other. The second electrode CE2 of the first capacitor Cst may overlap the first electrode CE1 with the second gate insulating layer 113 (see FIG. 4) disposed therebetween. Here, the second gate insulating layer 113 may act as a dielectric layer of the first capacitor Cst.

A node connecting line 171 (see FIG. 3) may be electrically connected to the first electrode CE1 and the third semiconductor layer of the third transistor T3. The second electrode CE2 may be electrically connected to the first power voltage line 172 that may be electrically connected to the second power voltage line 183. The first and second power voltage lines 172 and 183 may extend in the second direction (y). The second electrode CE2 may extend in the first direction (x) and may transfer the first power voltage ELVDD in the first direction (x). Accordingly, the first and second power voltage lines 172 and 183 and second electrodes CE2 may form a mesh structure in the display area DA.

The second transistor T2 may include the second semiconductor layer and the second gate electrode G2. The second semiconductor layer may include a second channel region A2, and a second source region S2 and a second drain region D2 at opposite sides of the second channel region A2. The second source region S2 may be electrically connected to the data line 181, and the second drain region D2 may be electrically connected to the first source region S1. The second gate electrode G2 may be a part of the first scan line 133.

The fifth transistor T5 may include a fifth semiconductor layer and a fifth gate electrode G5. The fifth semiconductor layer may include a fifth channel region A5, and a fifth source region S5 and a fifth drain region D5 at opposite sides of the fifth channel region A5. The fifth source region S5 may be electrically connected to the first power voltage line 172, and the fifth drain region D5 may be electrically connected to the first source region S1. The fifth gate electrode G5 may be a part of the emission control line 135.

The sixth transistor T6 may include a sixth semiconductor layer and a sixth gate electrode G6. The sixth semiconductor layer may include a sixth channel region A6, and a sixth source region S6 and a sixth drain region D6 at opposite sides of the sixth channel region A6. The sixth source region S6 may be electrically connected to the first drain region D1, and the sixth drain region D6 may be electrically connected to the pixel electrode 310 (see FIG. 5) of the organic light-emitting diode OLED. The sixth gate electrode G6 may be a part of the emission control line 135.

The seventh transistor T7 may include a seventh semiconductor layer and a seventh gate electrode G7. The seventh semiconductor layer may include a seventh channel region A7, and a seventh source region S7 and a seventh drain region D7 at opposite sides of the seventh channel region A7. The seventh source region S7 may be electrically connected to the second initialization voltage line 164, and the seventh drain region D7 may be electrically connected to the sixth drain region D6. The seventh gate electrode G7 may be a part of the second scan line 133'.

The first interlayer insulating layer 114 (see FIG. 4) may be disposed on the first, second, fifth to seventh transistors T1, T2, T5, T6, and T7 including the silicon semiconductor, and the third and fourth transistors T3 and T4 including the oxide semiconductor may be disposed on the first interlayer insulating layer 114.

The semiconductor layers of the third transistor T3 and the fourth transistor T4 may be at the same layer and may include the same or similar material. For example, the semiconductor layers may each include oxide semiconductor.

The semiconductor layers may each include a channel region, and a source region and a drain region at opposite sides of the channel region. For example, the source region and the drain region may be regions in which a carrier concentration has increased due to a plasma treatment. The source region and the drain region may respectively correspond to a source electrode and a drain electrode.

The third transistor T3 may include a third semiconductor layer including an oxide semiconductor, and a third gate electrode G3. The third semiconductor layer may include a third channel region A3, and a third source region S3 and a third drain region D3 at opposite sides of the third channel region A3. The third source region S3 may be bridged to the first gate electrode G1 via the node connecting line 171. The third source region S3 may be electrically connected to the fourth drain region D4 at the same layer. The third drain region D3 may be electrically connected to the first semiconductor layer of the first transistor T1 and the sixth semiconductor layer of the sixth transistor T6. The third gate electrode G3 may be a part of the fourth scan line SL4.

The fourth transistor T4 may include a fourth semiconductor layer including an oxide semiconductor, and a fourth gate electrode G4. The fourth semiconductor layer may include a fourth channel region A4, and a fourth source region S4 and a fourth drain region D4 at opposite sides of the fourth channel region A4. The fourth source region S4 may be electrically connected to the first initialization voltage line 147, and the fourth drain region D4 may be bridged to the first gate electrode G1 via the node connecting line 171. The fourth gate electrode G4 may be a part of the third scan line SL3.

The third gate insulating layer 115 (see FIG. 4 and FIG. 5) may be disposed between the third semiconductor layer and the third gate electrode G3 and disposed between the fourth semiconductor layer and the fourth gate electrode G4, to correspond to the channel regions.

The third electrode CE3 of the second capacitor Cbt may be a part of the first scan line 133 and may be electrically connected to the gate electrode G2 of the second transistor T2. The fourth electrode CE4 of the second capacitor Cbt may overlap the third electrode CE3 and may include the oxide semiconductor. The fourth electrode CE4 may be disposed at the same layer as that of the third semiconductor layer of the third transistor T3 and the fourth semiconductor layer of the fourth transistor T4, and may be disposed between the third semiconductor layer and the fourth semiconductor layer. Alternatively, the fourth electrode CE4 may extend from the fourth semiconductor layer. Alternatively, the fourth electrode CE4 may extend from the third semiconductor layer.

The second interlayer insulating layer 116 (see FIG. 4 and FIG. 5) may be disposed on the third and fourth transistors T3 and T4 including an oxide semiconductor, and the first power voltage line 172, the node connecting line 171, for example may be disposed on the second interlayer insulating layer 116.

The first planarization layer 118 (see FIG. 4 and FIG. 5) may be disposed on the first power voltage line 172, and the data line 181 and the second power voltage line 183 may be disposed on the first planarization layer 118 while extending in the second direction (y).

In an embodiment, the first scan line 133, the second scan line 133', and the emission control line 135 may be disposed at the same layer as that of the first gate electrode G1 and may include the same or similar material as that of the first gate electrode G1.

In an embodiment, some or a predetermined number of the wires may include two conductive layers disposed at different layers. For example, the third scan line SL3 may include a lower scan line 143 and an upper scan line 163 that may be disposed at different layers from each other. The lower scan line 143 may be disposed at the same layer as that of the second electrode CE2 of the first capacitor Cst, and may include the same or similar material as that of the second electrode CE2. The upper scan line 163 may be disposed on the third gate insulating layer 115 (see FIG. 4). The lower scan line 143 may at least partially overlap the upper scan line 163. The lower scan line 143 and the upper scan line 163 may partially correspond to the third gate electrode of the third transistor T3, and thus, the third transistor T3 may have a dual-gate structure including control electrodes at upper and lower portions of the semiconductor layer.

Also, the fourth scan line SL4 may include a lower scan line 145 and an upper scan line 165 that may be disposed at different layers from each other. The lower scan line 145 may be disposed at the same layer as that of the second electrode CE2 of the first capacitor Cst, and may include the same or similar material as that of the second electrode CE2. The upper scan line 165 may be disposed on the third gate insulating layer 115 (see FIG. 5). The lower scan line 145 may at least partially overlap the upper scan line 165. The lower scan line 145 and the upper scan line 165 may correspond to parts of the fourth gate electrode G4 of the fourth transistor T4, and thus, the fourth transistor T4 may have a dual-gate structure including control electrodes at upper and lower portions of the semiconductor layer.

The initialization voltage line VIL may include a first initialization voltage line 147 and a second initialization voltage line 164 disposed at different layers. The first initialization voltage line 147 may be disposed at the same layer as that of the second electrode CE2 of the first capacitor Cst, and may include the same or similar material as that of the second electrode CE2. The second initialization voltage line 164 may be disposed at the same layer as that of the first power voltage line 172 and may include the same or similar material as that of the first power voltage line 172.

The pixel circuit according to an embodiment may include a shielding pattern SHP that may overlap at least one of the signal lines. The shielding pattern SHP may be provided such that the transistors may not be affected by the signals supplied to the signal lines.

In FIG. 3, the shielding pattern SHP may overlap the fourth scan line SL4 and extend in the first direction (x) between the first transistor T1 and the second transistor T2. The shielding pattern SHP may be disposed at the same layer as that of the semiconductor layer of the first transistor T1. However, one or more embodiments are not limited thereto. In an embodiment, the shielding pattern SHP may overlap the emission control line EL and may be at a different layer from that of the semiconductor layer of the first transistor T1. Functions of the shielding pattern SHP will be described later in detail.

Hereinafter, the structure of the display apparatus according to an embodiment will be described in detail with reference to FIGS. 4 and 5 according to a stacking order.

FIGS. 4 and 5 show schematic cross-sections of a portion corresponding to the first transistor T1, the third transistor T3, the fourth transistor T4, the fifth transistor T5, the sixth transistor T6, the first capacitor Cst, the second capacitor Cbt, and the organic light-emitting diode OLED shown in FIG. 3, and some reference elements may be omitted.

The substrate 100 may include a glass material, a ceramic material, a metal material, a plastic material, or a flexible or bendable material. In a case that the substrate 100 is flexible or bendable, the substrate 100 may include a polymer resin such as a polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), for example.

The substrate 100 may have a single-layered or a multi-layered structure of the above materials, and the multi-layered structure may include an inorganic layer. For example, the substrate 100 may include a first organic base layer 101, a first inorganic barrier layer 103, a second organic base layer 105, and a second inorganic barrier layer 107. The first organic base layer 101 and the second organic base layer 105 may each include a polymer resin. The first inorganic barrier layer 103 and the second inorganic barrier layer 107 may be barrier layers for preventing infiltration of external impurities, and may have a single-layered or multi-layered structure including an inorganic material such as silicon nitride ($SiN_x$) or silicon oxide ($SiO_x$).

A buffer layer 111 may be disposed on the substrate 100. The buffer layer 111 may improve flatness of an upper surface of the substrate 100 and may include an oxide layer such as silicon oxide ($SiO_x$) and/or a nitride layer such as silicon nitride ($SiN_x$), or silicon oxynitride ($SiO_xN_y$).

Figure 6A:
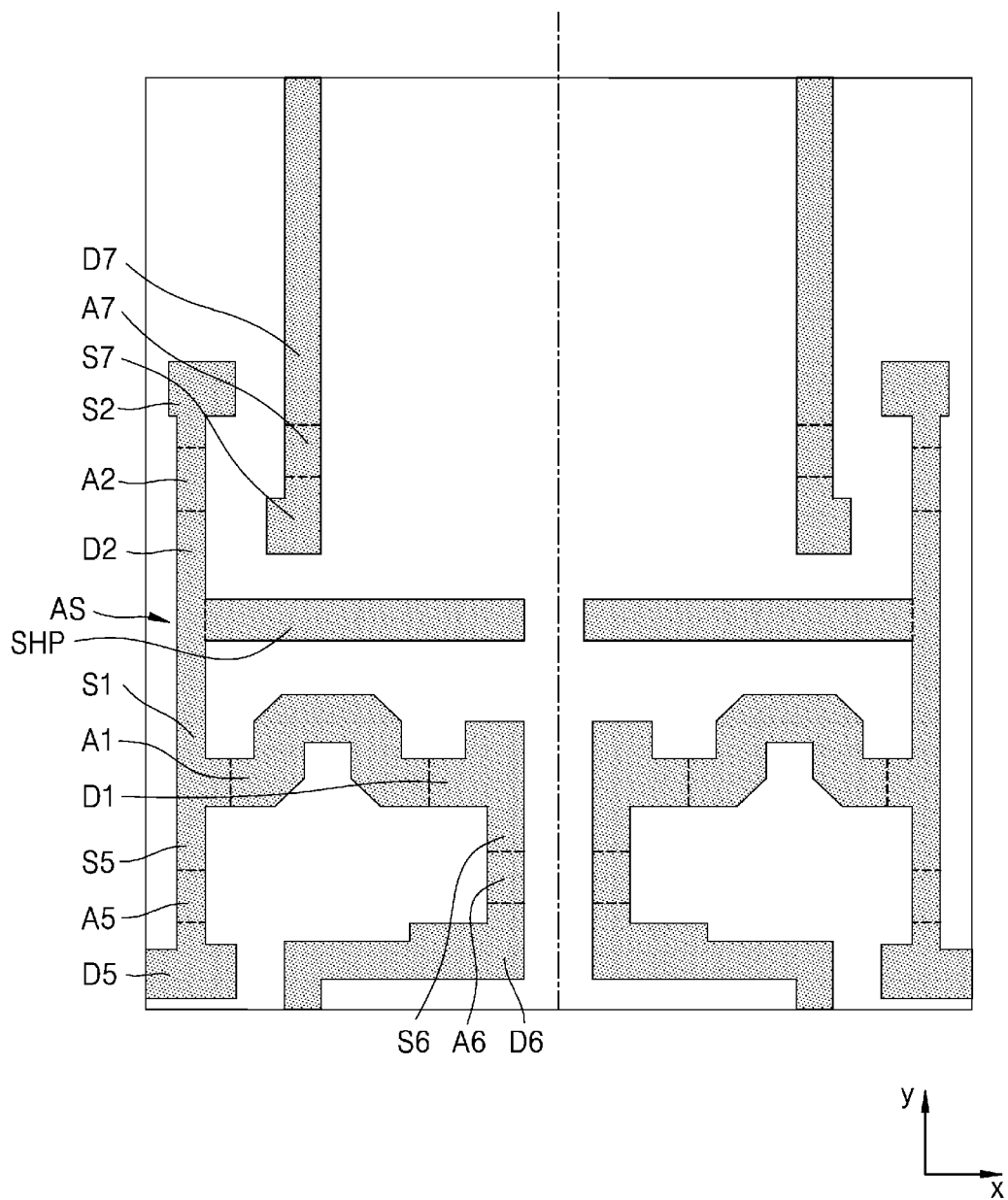
FIGS. 6A to 6G are layouts showing elements of FIG. 3 according to layers.

As shown in FIG. 6A, semiconductor layer AS of the first, second, fifth, sixth, and seventh transistors T1, T2, T5, T6, and T7 may be disposed on the buffer layer 111.

The semiconductor layer AS may include the channel region A1, the source region S1, and the drain region D1, that is, a first semiconductor layer AS1 of the first transistor T1, the channel region A2, the source region S2, and the drain region D2, that is, the second semiconductor layer AS2 (not illustrated) of the second transistor T2, the channel region A5, the source region S5, and the drain region D5, that is, a fifth semiconductor layer AS5 of the fifth transistor T5, the channel region A6, the source region S6, and the drain region D6, that is, a sixth semiconductor layer AS6 of the sixth transistor T6, the channel region A7, the source region S7, and the drain region D7, that is, the seventh semiconductor layer of the seventh transistor T7. The channel region, the source region, and the drain region in each of the first, second, and fifth to seventh transistors T1, T2, T5, T6, and T7 may be parts of the semiconductor layer AS.

Also, the semiconductor layer AS may include the shielding pattern SHP that may extend in the first direction between the source region S1 of the first transistor T1 and the drain region D2 of the second transistor T2. The shielding pattern SHP may be a part of the semiconductor layer AS.

The first gate insulating layer 112 may be disposed on the semiconductor layer AS. The first gate insulating layer 112 may include an inorganic material including an oxide material or a nitride material. For example, the first gate insulating layer 112 may include at least one selected from an insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

Figure 6B:
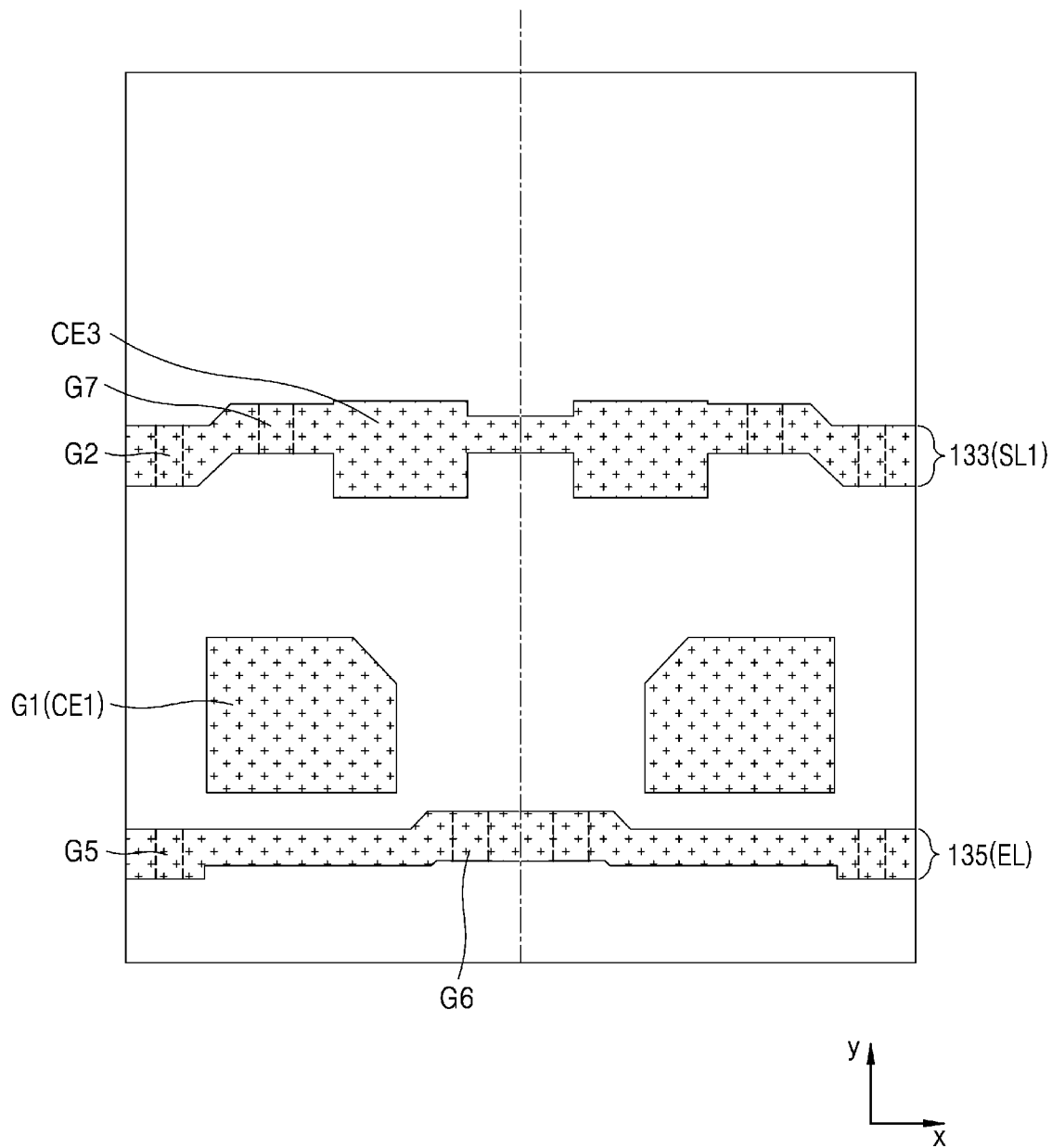
Figure 6C:
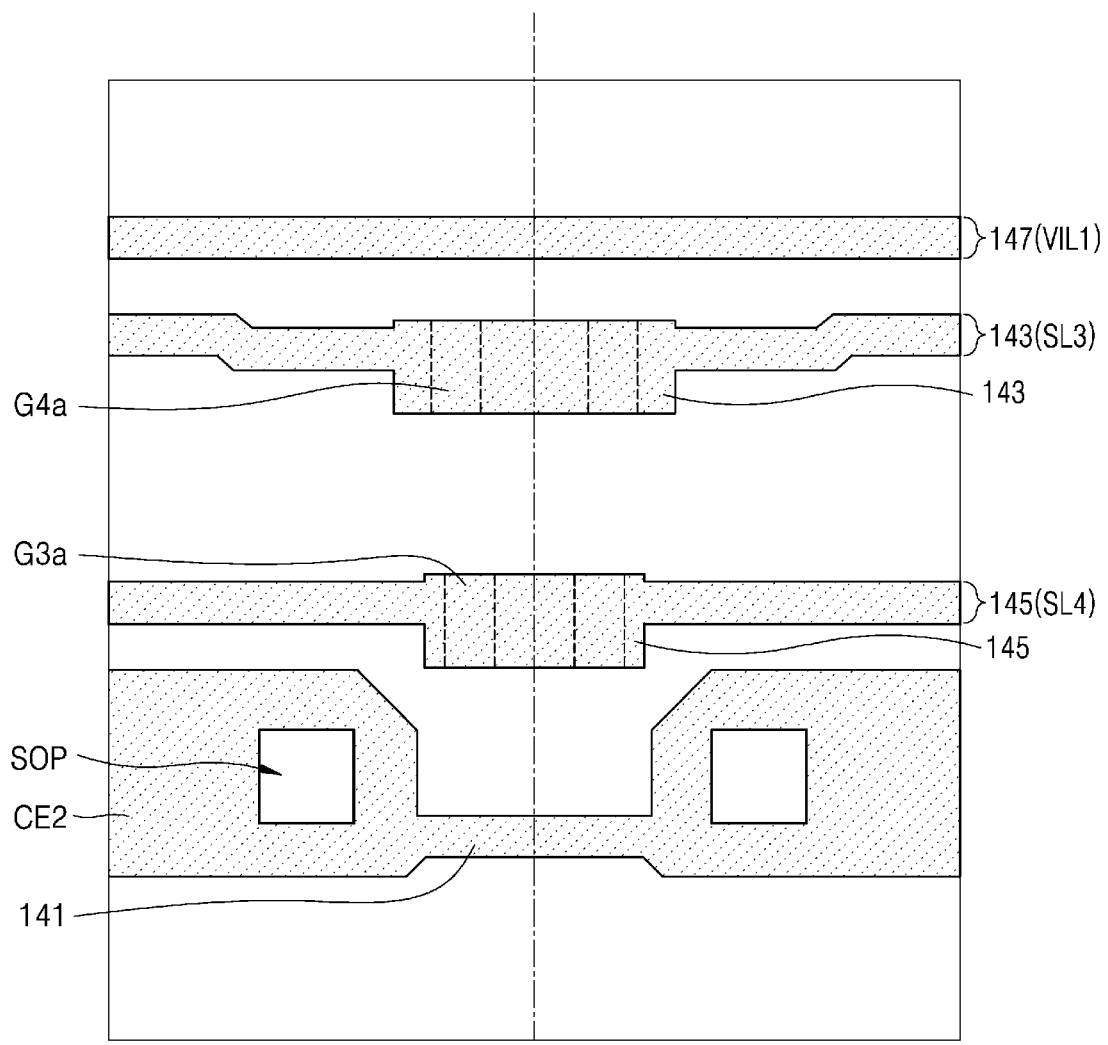

As shown in FIG. 6B, the gate electrode G1 of the first transistor T1, the gate electrode G2 of the second transistor T2, the gate electrode G5 of the fifth transistor T5, the gate electrode G6 of the sixth transistor T6, and the gate electrode G7 of the seventh transistor T7 may be disposed on the first gate insulating layer 112. The first scan line 133 and the emission control line 135 may extend in the first direction (x) on the first gate insulating layer 112. A part of the first scan line 133 may correspond to the third electrode CE3 of the second capacitor Cbt.

The gate electrode G1 of the first transistor T1 may be of an island type. The gate electrode G2 of the second transistor T2 may be a part of the first scan line 133 intersecting with the semiconductor layer AS. The gate electrode G7 of the seventh transistor T7 may be a part of the first scan line 133 intersecting with the semiconductor layer AS or a part of the second scan line 133' (see FIG. 3) that may be a first scan line of a next row. FIG. 6B shows an example, in which the gate electrode G7 of the seventh transistor T7 in a pixel of a previous row is a part of the first scan line 133 intersecting with the semiconductor layer AS. The gate electrode G5 of the fifth transistor T5 and the gate electrode G6 of the sixth transistor T6 may be parts of the emission control line 135 intersecting with the semiconductor layer AS.

The gate electrode G1 of the first transistor T1 may not only function as a control electrode of the first transistor, but may also function as the first electrode CE1 of the first capacitor Cst.

The gate electrodes of the first transistor T1, the second transistor T2, the fifth transistor T5, the sixth transistor T6, and the seventh transistor T7 may each include aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), copper (Cu), for example. The gate electrodes may have a single-layered or multi-layered structure including at least one selected from the above stated materials.

The second gate insulating layer 113 may be disposed on the gate electrodes. The second gate insulating layer 113 may include an inorganic material including an oxide material or a nitride material. For example, the second gate insulating layer 113 may include at least one selected from an insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

The second electrode CE2 overlapping the first electrode CE1 may be disposed on the second gate insulating layer 113. The second electrode CE2 may include an opening SOP. The opening SOP may be obtained by partially removing the second electrode CE2 and may have a closed shape.

The second gate insulating layer 113 may act as a dielectric layer of the first capacitor Cst. The second electrodes CE2 in adjacent pixels may be electrically connected to each other via a bridge 141 as in FIG. 6C. The bridge 141 may protrude from the second electrode CE2 in the first direction (x) and may be integrally provided or may be integral with each other with the second electrode CE2.

The second electrode CE2 of the first capacitor Cst may have a single or multi-layered structure including one or more materials selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), or copper (Cu), for example.

The first initialization voltage line 147, the lower scan line 143 of the third scan line SL3, and the lower scan line 145 of the fourth scan line SL4 may extend on the second gate insulating layer 113 in the first direction (x), and may include the same or similar material as that of the second electrode CE2 of the first capacitor Cst. In the lower scan line 143 of the third scan line SL3, a portion overlapping a semiconductor layer AO may be a lower gate electrode G4a of the fourth transistor T4. In the lower scan line 145 of the fourth scan line SL4, a portion overlapping the semiconductor layer AO may be a lower gate electrode G3a of the third transistor T3.

The first interlayer insulating layer 114 may be disposed on the second electrode CE2 of the first capacitor Cst. The first interlayer insulating layer 114 may include an inorganic material including an oxide material or a nitride material. For example, the first interlayer insulating layer 114 may include at least one selected from an insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

Figure 6D:
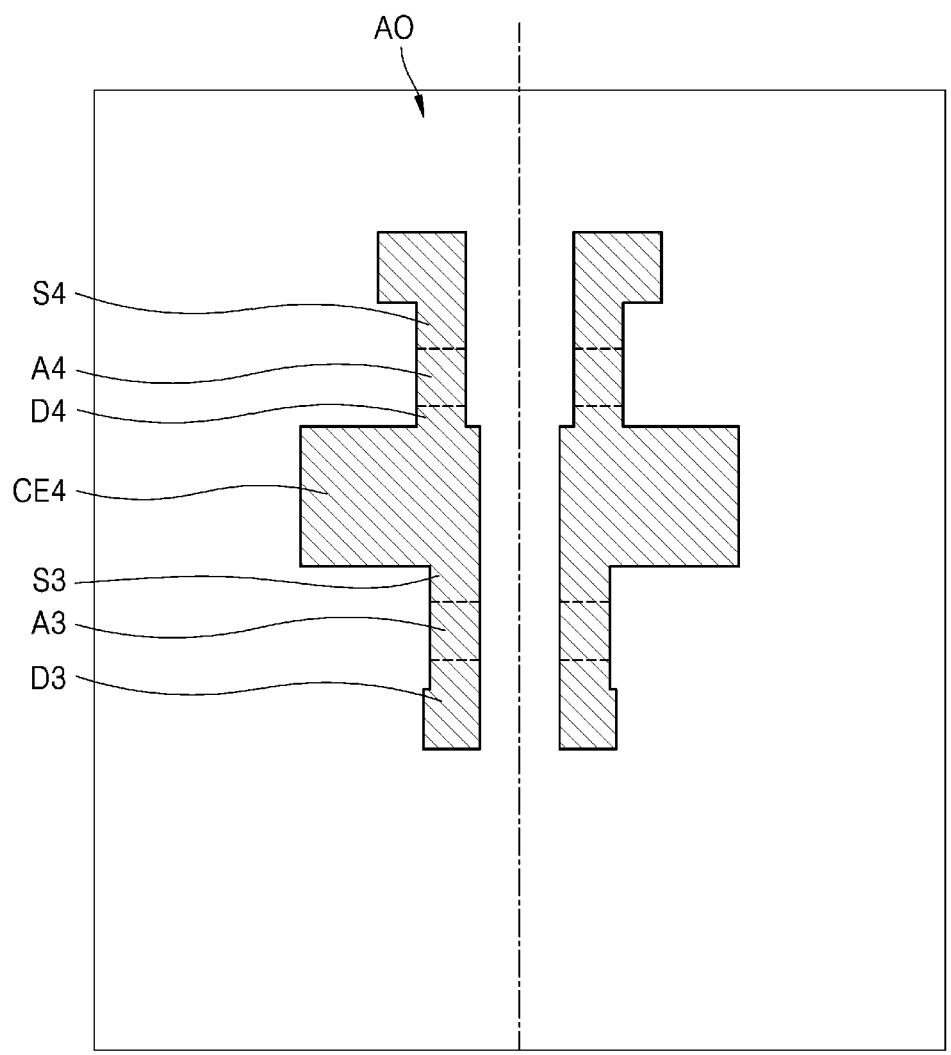

As shown in FIG. 6D, the semiconductor layer AO including an oxide semiconductor may be disposed on the first interlayer insulating layer 114. The semiconductor layer AO may include Zn oxide-based material, for example, Zn oxide, In—Zn oxide, Ga—In—Zn oxide, for example. In an embodiment, the semiconductor layer AO may include In—Ga—Zn—O (IGZO), In—Sn—Zn—O (ITZO), or In—Ga—Sn—Zn—O (IGTZO) semiconductor including ZnO with metal such as indium (In), gallium (Ga), and tin (Zn).

The semiconductor layers of the third transistor T3 and the fourth transistor T4 may each include the channel region, and the source and drain regions at opposite sides of the channel region. The source region and the drain region in each of the third transistor T3 and the fourth transistor T4 may be obtained by making the oxide semiconductor conductive by adjusting a carrier concentration of the oxide semiconductor. For example, the source region and the drain region of the third and fourth transistors T3 and T4 may be obtained by increasing the carrier concentration of the oxide semiconductor through a plasma treatment on the oxide semiconductor by using a hydrogen (H)-based gas, a fluorine (F)-based gas, or a combination thereof.

The semiconductor layer AO may include the channel region A3, the source region S3, and the drain region D3, that is, a third semiconductor layer AO3 of the third transistor T3, and the channel region A4, the source region S4, and the drain region D4, that is, a fourth semiconductor layer AO4 of the fourth transistor T4. The channel region, the source region, and the drain region in each of the third and fourth transistors T3 and T4 may be parts of the semiconductor layer AO. The source region S4 of the fourth transistor T4 may overlap the first initialization voltage line 147.

The semiconductor layer AO may include the fourth electrode CE4 of the second capacitor Cbt. The fourth electrode CE4 of the second capacitor Cbt may be disposed between the semiconductor layer AO3 of the third transistor T3 and the semiconductor layer AO4 of the fourth transistor T4. The fourth electrode CE4 may extend from the semiconductor layer AO3 of the third transistor T3 or the semiconductor layer AO4 of the fourth transistor T4. The fourth electrode CE4 may include an oxide semiconductor, and may be disposed on the first interlayer insulating layer 114. The second gate insulating layer 113 and the first interlayer insulating layer 114 may be disposed between the third electrode CE3 and the fourth electrode CE4 of the second capacitor Cbt, and the second gate insulating layer 113 and the first interlayer insulating layer 114 may also act as a dielectric layer of the second capacitor Cbt.

Figure 6E:
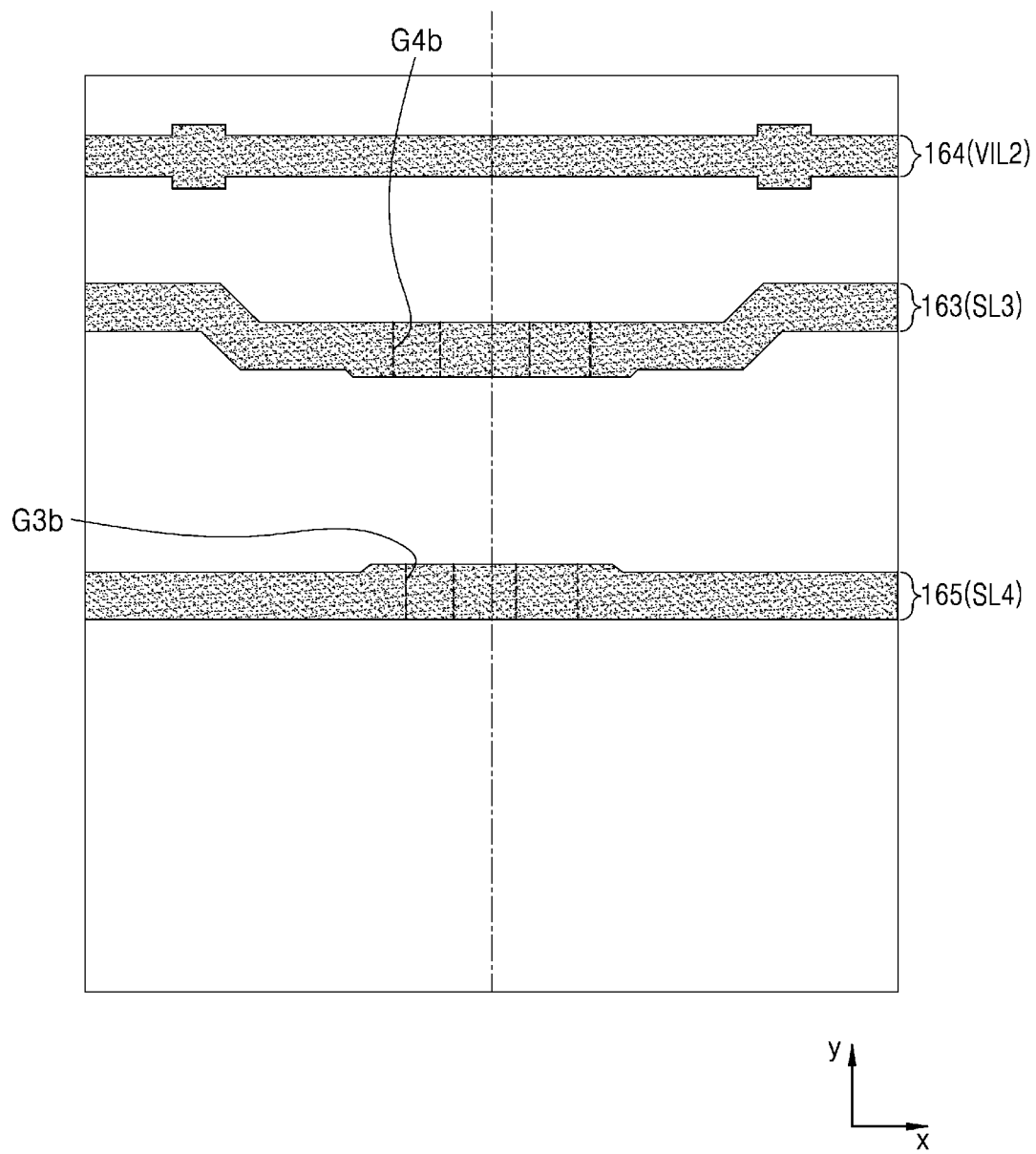

As shown in FIG. 6E, the second initialization voltage line 164, the upper scan line 163 of the third scan line SL3, and the upper scan line 165 of the fourth scan line SL4 may be disposed on the semiconductor layer AO while extending in the first direction (x). In an embodiment, the third scan line SL3 and the fourth scan line SL4 may include two conductive layers disposed at different layers from each other.

The upper scan line 163 of the third scan line SL3 may at least partially overlap the lower scan line 143. The upper scan line 165 of the fourth scan line SL4 may at least partially overlap the lower scan line 145. The third gate insulating layer 115 may be disposed between the semiconductor layer AO and the upper scan line 163 of the third scan line SL3 and disposed between the semiconductor layer AO and the upper scan line 165 of the fourth scan line SL4. The third gate insulating layer 116 may be patterned to correspond to the upper scan line 163 of the third scan line SL3 and the upper scan line 165 of the fourth scan line SL4.

In the upper scan line 163 of the third scan line SL3, a portion overlapping the fourth semiconductor layer AO4 may be an upper gate electrode G4b of the fourth transistor T4. In the upper scan line 165 of the fourth scan line SL4, a portion overlapping the third semiconductor layer AO3 may be an upper gate electrode G3b of the third transistor T3. The third transistor T3 and the fourth transistor T4 may each have a dual-gate structure, in which control electrodes may be provided or disposed on and under or below the semiconductor layer.

The third gate insulating layer 115 may include an inorganic material including an oxide material or a nitride material. For example, the third gate insulating layer 115 may include at least one selected from an insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The upper gate electrode G3b of the third transistor T3 and the upper gate electrode G4b of the fourth transistor T4 may be disposed on the third gate insulating layer 115, and may each have a single-layered or multi-layered structure including at least one of molybdenum (Mo), copper (Cu), or titanium (Ti), for example.

Figure 6F:
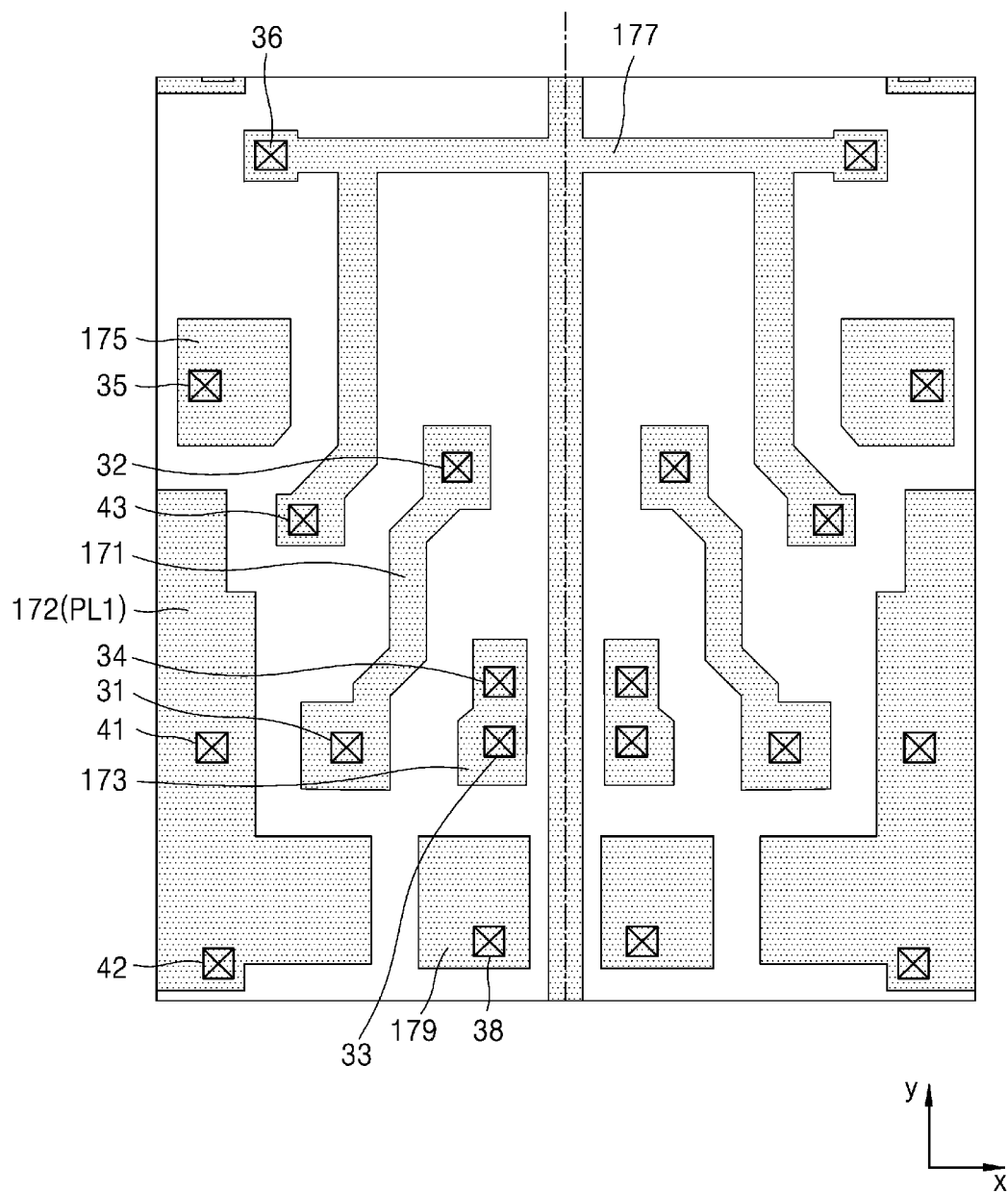

The second interlayer insulating layer 116 may cover or overlap the third transistor T3 and the fourth transistor T4. The second interlayer insulating layer 116 may be disposed on the upper gate electrode G3b of the third transistor and the upper gate electrode G4b of the fourth transistor T4. As shown in FIG. 6F, the first power voltage line 172, the node connecting line 171, and connecting electrodes 173, 175, 177, and 179 may be disposed on the second interlayer insulating layer 116.

The second interlayer insulating layer 116 may include an inorganic material including an oxide or a nitride. For example, the second interlayer insulating layer 116 may include at least one selected from an insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

The first power voltage line 172, the node connecting line 171, and the connecting electrodes 173, 175, 177, and 179 may each include a highly conductive material such as metal, conductive oxide, for example. For example, the first power voltage line 172, the node connecting line 171, and the connecting electrodes 173, 175, 177, and 179 may each have a single-layered or multi-layered structure including at least one selected from aluminum (Al), copper (Cu), or titanium (Ti), for example. In an embodiment, the first power voltage line 172, the node connecting line 171, and the connecting electrodes 173, 175, 177, and 179 may have a triple-layered structure including titanium, aluminum, and titanium (Ti/Al/Ti) that may be sequentially stacked.

The first power voltage line 172 may be electrically connected to the second electrode CE2 of the first contact hole Cst via a contact hole 41 in the first interlayer insulating layer 114 and the second interlayer insulating layer 116. The first power voltage line 172 may be electrically connected to the fifth drain region D5 of the fifth transistor T5 via a contact hole 42 in the first gate insulating layer 112, the second gate insulating layer 113, the first interlayer insulating layer 114, and the second interlayer insulating layer 116.

An end of the node connecting line 171 may be electrically connected to the first gate electrode G1 via a contact hole 31. The contact hole 31 may penetrate through the second interlayer insulating layer 116, the first interlayer insulating layer 114, and the second gate insulating layer 113, and may expose the first gate electrode G1. A part of the node connecting line 171 may be inserted in the contact hole 31 to be electrically connected to the first gate electrode G1.

The contact hole 31 may be in the opening SOP of the second electrode CE2 to be spaced apart from an edge of the opening SOP, and the node connecting line 171 may be inserted in the contact hole 31 and may be electrically insulated from the second electrode CE2.

The other end of the node connecting line 171 may be electrically connected to the oxide semiconductor layer, for example, the fourth electrode CE4 of the second capacitor Cbt, or the fourth semiconductor layer AO4 or the third semiconductor layer AO3, via a contact hole 32. The contact hole 32 may penetrate through the second interlayer insulating layer 116 and expose the oxide semiconductor layer.

The fourth electrode CE4 of the second capacitor Cbt may be electrically connected to the node connecting line 171 to be electrically connected to the first gate electrode G1. Accordingly, the second capacitor Cbt may raise a voltage at the node N2 (see FIG. 2) to clearly represent a black grayscale in a case that the first scan signal Sn supplied to the first scan line SL1 may be turned off.

An end of the connecting electrode 173 may be electrically connected to the first drain region D1 of the first transistor T1 and the sixth source region S6 of the sixth transistor T6 via a contact hole 33. The contact hole 33 may penetrate through the first gate insulating layer 112, the second gate insulating layer 113, the first interlayer insulating layer 114, and the second interlayer insulating layer 116 and expose the silicon semiconductor layer. The other end of the connecting electrode 173 may be electrically connected to the third drain region D3 of the third transistor T3 via a contact hole 34. The contact hole 34 may penetrate through the second interlayer insulating layer 116 and expose the oxide semiconductor layer.

The connecting electrode 175 may be electrically connected to the second source region S2 of the second transistor T2 via a contact hole 35 in the first gate insulating layer 112, the second gate insulating layer 113, the first interlayer insulating layer 114, and the second interlayer insulating layer 116.

The connecting electrode 177 may be partially connected to the first initialization voltage line 164 via a contact hole 36 in the second interlayer insulating layer 116. The connecting electrode 177 may be provided in a shape of + and may extend not only in the first direction (x), but also may extend in the second direction (y) to electrically connect the first initialization voltage line 164 in a mesh structure.

The connecting electrode 179 may be electrically connected to the drain region D6 of the sixth transistor T6 via a contact hole 38 in the first gate insulating layer 112, the second gate insulating layer 113, the first interlayer insulating layer 114, and the second interlayer insulating layer 116.

Figure 6G:
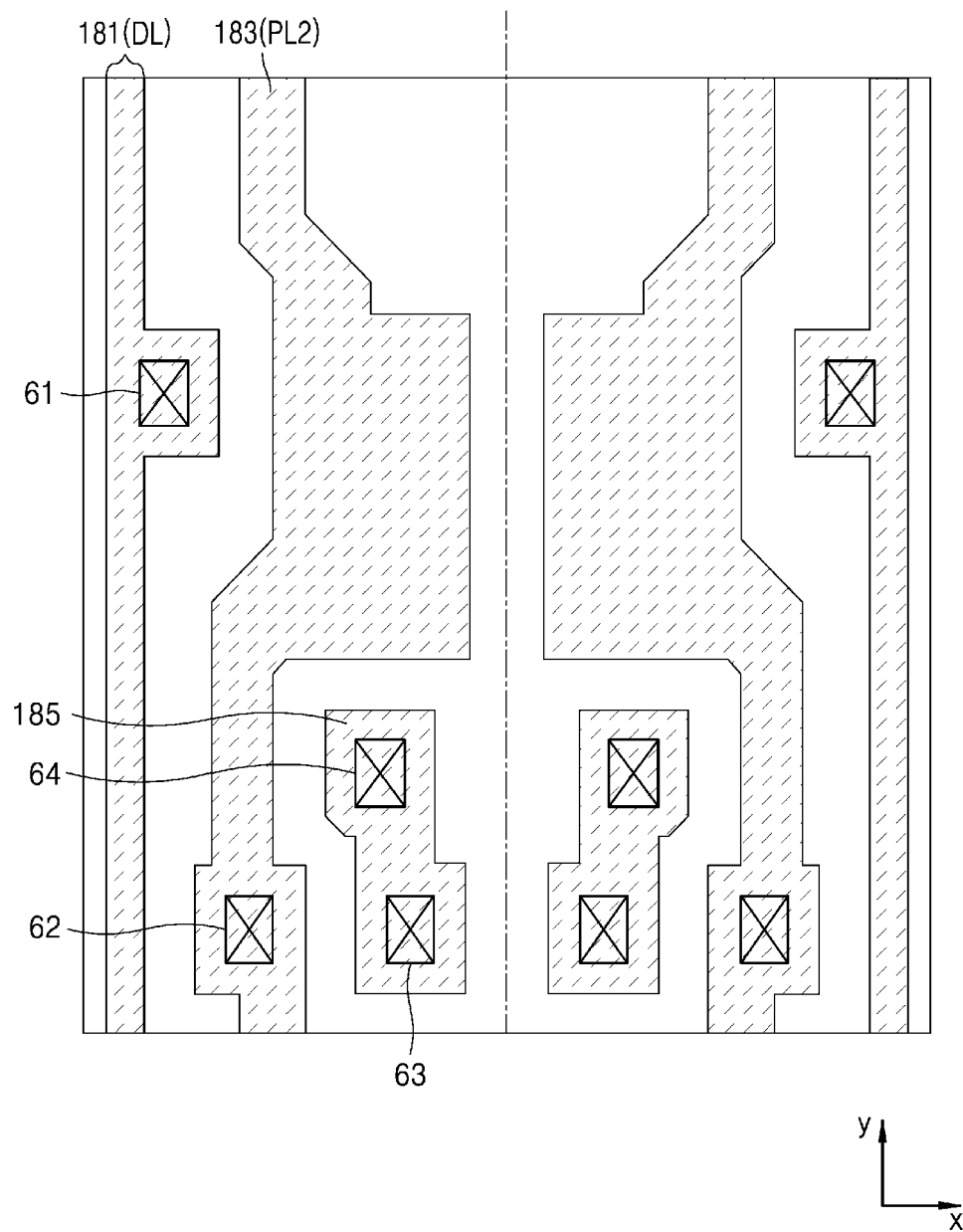

The first planarization layer 118 may be disposed on the first power voltage line 172, the node connecting line 171, and the connecting electrodes 173, 175, 177, and 179. As shown in FIG. 6G, the data line 181, the second power voltage line 183, and the connecting electrode 185 may be disposed on the first planarization layer 118.

The data line 181 may be electrically connected to the connecting electrode 175 via a contact hole 61 in the first planarization layer 118 to be electrically connected to the second source region S2 of the second transistor T2. The data line 181 may partially overlap the first power voltage line 172. As shown in FIG. 4, the first power voltage line 172 may be disposed between the first gate electrode G1 of the first transistor T1 and the data line 181 in a schematic cross-sectional view. A region P1 of the first power voltage line 172 may be disposed between the data line 181 and the node connecting line 171 in a plan view. Accordingly, the first power voltage line 172 may reduce coupling between the node connecting line 171 and the first gate electrode G1 and between the node connecting line 171 and the data line 181. FIG. 4 illustrates a third direction (z) indicating a thickness direction.

The second power voltage line 183 may be electrically connected to the first power voltage line 172 via a contact hole 62 in the first planarization layer 118. The second power voltage line 183 may cover or overlap the third semiconductor layer AO3 of the third transistor T3 and the fourth semiconductor layer AO4 of the fourth transistor T4. Accordingly, the second power voltage line 183 may block the light that may be applied from above the substrate 100. The second power voltage line 183 may partially overlap the node connecting line 171. A part of the second power voltage line 183 may be disposed between the data line 181 and the node connecting line 171 in a plan view. Accordingly, the second power voltage line 183 may reduce coupling between the node connecting line 171 and the data line 181.

The connecting electrode 185 may be electrically connected to the connecting electrode 179 via a contact hole 63 in the first planarization layer 118 to be electrically connected to the drain region D6 of the sixth transistor T6. The connecting electrode 185 may be electrically connected to a pixel electrode 310 via a contact hole 64 in the second planarization layer 119 that may be disposed on the first planarization layer 118, and may transfer a signal applied through the sixth transistor T6 to the pixel electrode 310.

The first and second planarization layers 118 and 119 may include an organic material such as acryl, benzocyclobutene (BCB), polyimide, hexamethyldisiloxane (HMDSO), for example. Alternatively, the first and second planarization layers 118 and 119 may include an inorganic material. The first and second planarization layers 118 and 119 may function as protective layers covering or overlapping the first to seventh transistors T1 to T7 and may be provided to planarize upper portions thereof. The first and second planarization layers 118 and 119 may each have a single-layered or multi-layered structure.

A pixel defining layer 120 may be disposed on the second planarization layer 119. The pixel defining layer 120 may include an opening corresponding to each sub-pixel, that is, an opening that exposes at least a center of the pixel electrode 310, to define pixels. Also, the pixel defining layer 120 may increase a distance between an edge of the pixel electrode 310 and an opposite electrode 330 disposed on the pixel electrode 310 to prevent generation of an arc at the edge of the pixel electrode 310. The pixel defining layer 120 may include an organic material, for example, polyimide, hexamethyldisiloxane (HMDSO), for example.

An intermediate layer 320 of the organic light-emitting diode OLED may include a low-molecular weight organic material or a polymer material. In a case that the intermediate layer 320 may include a low-molecular weight material, the intermediate layer 320 may include, although not illustrated, a hole injection layer (HIL), a hole transport layer (HTL), an emission layer (EML), an electron transport layer (ETL), and an electron injection layer (EIL) in a single or multi-layered structure, and examples of the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$). The above layers may be manufactured by a vacuum deposition method.

In a case that the intermediate layer 320 may include a polymer material, the intermediate layer 320 may include an HTL and an EML. Here, the HTL may include PEDOT, and the EML may include a poly-phenylenevinylene (PPV)-based or polyfluorene-based polymer material. The intermediate layer 320 may be formed by using a screen printing method, an inkjet printing method, a laser induced thermal imaging (LITI) method, for example.

However, the intermediate layer 320 is not limited thereto, but may have various structures. For example, the intermediate layer 320 may be formed integrally over the pixel electrodes 310 or may be patterned to correspond to each of the pixel electrodes 310.

The opposite electrode 330 may be integrally provided or integral with each other or disposed over the organic light-emitting diodes OLED to correspond to pixel electrodes 310.

Because the organic light-emitting diode OLED may be easily damaged by external oxygen or moisture, a thin film encapsulation layer (not shown) or a sealing substrate (not shown) may be disposed on the organic light-emitting diode OLED to cover or overlap and protect the organic light-emitting diode OLED. The thin film encapsulation layer (not shown) may cover or overlap the display area DA and may extend to the outside of the display area DA. The thin film encapsulation layer may include an inorganic encapsulation layer including at least one inorganic material and an organic encapsulation layer including at least one organic material. In an embodiment, the thin film encapsulation layer may have a structure, in which a first inorganic encapsulation layer, an organic encapsulation layer, and a second inorganic encapsulation layer may be stacked. The sealing substrate (not shown) may be arranged or disposed facing the substrate 100, and may be bonded to the substrate 100 at the peripheral area PA by a sealing member such as a sealant or a frit.

Also, a spacer may be provided or disposed on the pixel defining layer 120 for preventing a dent in the mask, and various functional layers such as a polarization layer for reducing external light reflection, black matrix, a color filter, and/or a touch screen layer including a touch electrode may be provided or disposed on the thin film encapsulation layer.

Figure 7:
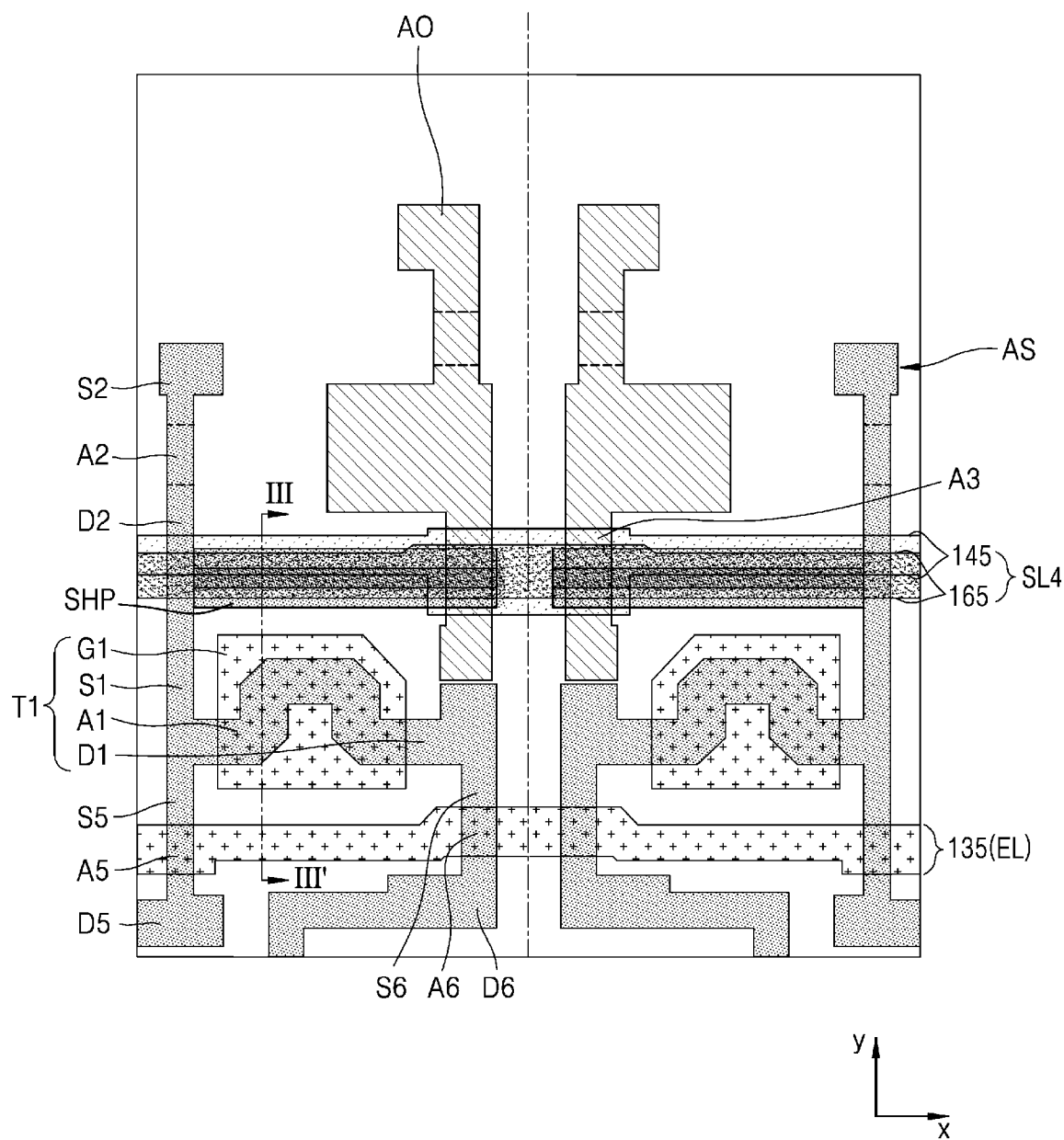
FIG. 7 is a layout showing some of the components of FIG. 3.
Figure 8:
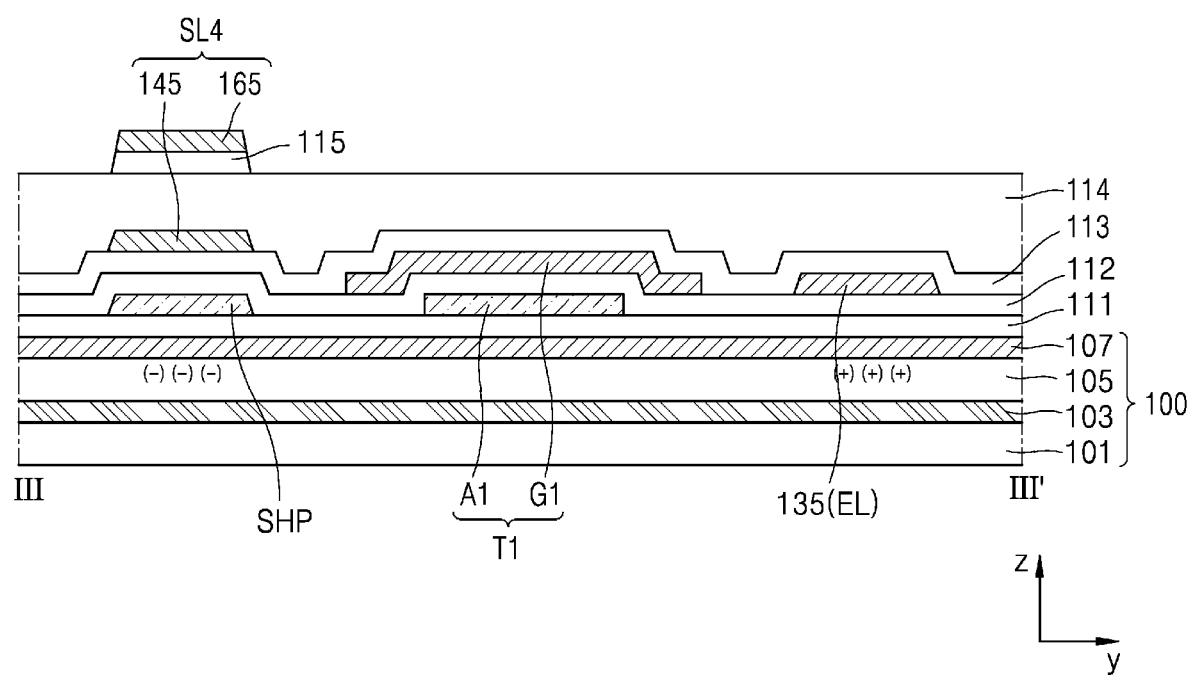
FIG. 8 is a schematic cross-sectional view of the display apparatus taken along line of FIG. 7.
Figure 9:
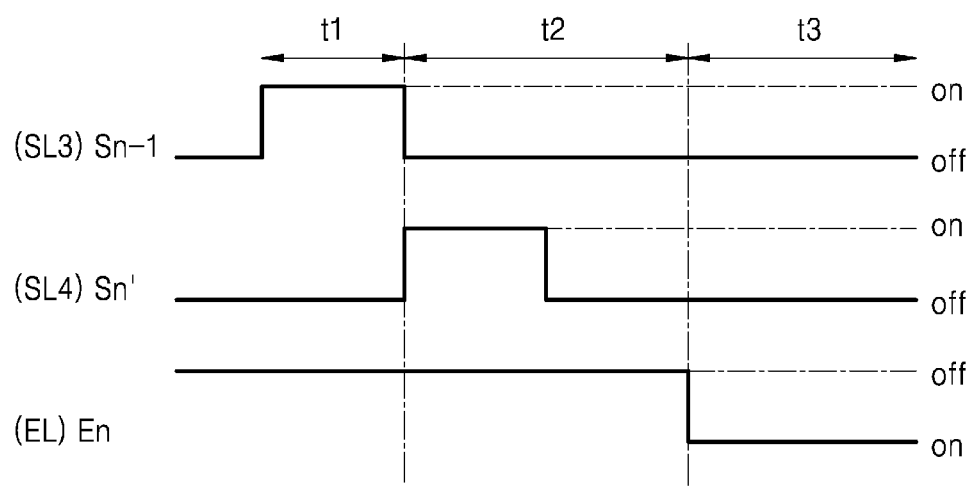
FIG. 9 is a waveform diagram of some or a predetermined number of signals input to a pixel circuit according to an embodiment.
Figure 10:
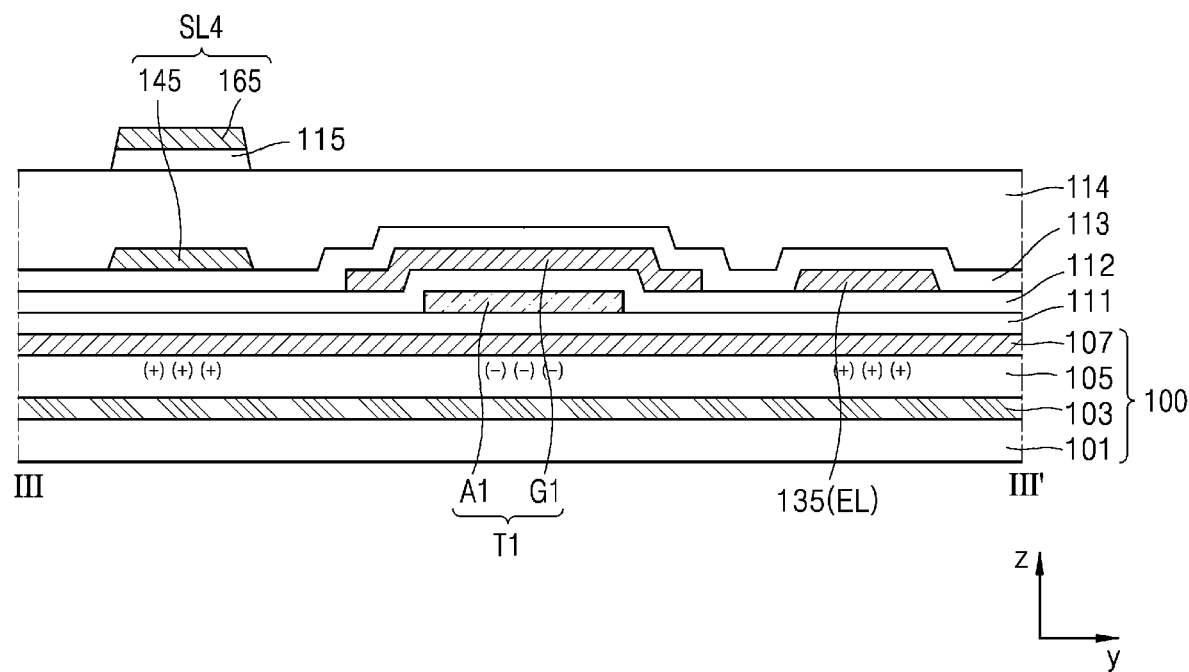
FIG. 10 is a schematic cross-sectional view of a display apparatus not including a shielding pattern, according to a comparative example.

FIG. 7 is a layout showing some components of FIG. 3, and FIG. 8 is a schematic cross-sectional view of the display apparatus taken along line of FIG. 7. FIG. 9 is a waveform diagram of some or a predetermined number of signals input to a pixel circuit according to an embodiment. FIG. 10 is a schematic cross-sectional view of a display apparatus not including a shielding pattern, according to a comparative example.

Referring to FIGS. 7 and 8, the emission control line EL may extend at a side of the first transistor T1 in the first direction in a plan view, and the fourth scan line SL4 may extend at the other side of the first transistor T1 in the first direction.

The emission control line EL may supply the emission control signal En (see FIG. 2) to the fifth transistor T5 and the sixth transistor T6 including the silicon semiconductor, and the fourth scan line SL4 may supply the fourth scan signal Sn' (see FIG. 2) to the third transistor T3 including the oxide semiconductor.

The shielding pattern SHP may extend in the first direction x and may overlap the fourth scan line SL4. The shielding pattern SHP may be disposed at the same layer as that of the semiconductor layer of the first transistor T1. In this case, the shielding pattern SHP may protrude between the semiconductor layer A2 of the second transistor T2 and the semiconductor layer A1 of the first transistor T1 in the first direction x. The shielding pattern SHP may extend to the semiconductor layer A3 of the third transistor T3 and may overlap the semiconductor layer A3 of the third transistor T3.

In a schematic cross-sectional view, the shielding pattern SHP may be disposed on the buffer layer 111, and may be disposed between the substrate 100 and the fourth scan line SL4. The shielding pattern SHP may include silicon semiconductor. The shielding pattern SHP may be a region that may be doped with impurities to increase a carrier concentration. A positive voltage may be applied to the shielding pattern SHP. For example, the shielding pattern SHP may be electrically connected to the first power voltage line PL1 to receive application of the first power voltage ELVDD. The power voltage line PL may be collectively referred to as a first power voltage line PL1 and a second power voltage line PL2, for example.

In an embodiment, the shielding pattern SHP may receive the first power voltage ELVDD only in a case that the organic light-emitting diode OLED emits light. During the light-emitting period, the fifth transistor T5 may be turned on and the first power voltage ELVDD may be transferred to the source region S1 of the first transistor T1 and the drain region D2 of the second transistor T2, and thus, the shielding pattern SHP arranged or disposed therebetween may receive the application of the first power voltage ELVDD.

In the drawings, the shielding pattern SHP may be integrally provided or integral with each other with the semiconductor layers of the first and second transistors T1 and T2. However, one or more embodiments are not limited thereto. In an embodiment, the shielding pattern SHP may be spaced apart from the semiconductor layers of the first and second transistors T1 and T2, and in this case, may be electrically connected to the first power voltage line PL1 via a contact hole.

The third transistor T3 including the oxide semiconductor may be classified as an NMOS due to its characteristics. In an embodiment, the fifth and sixth transistors T5 and T6 including the silicon semiconductor may be classified as PMOS transistors.

In a case that the transistor is provided as an NMOS transistor, the transistor is turned on in a case that a signal of a positive voltage is applied to the gate electrode of the transistor and turned off in a case that a signal of a negative voltage is applied to the gate electrode of the transistor. On the other hand, in a case that the transistor is provided as a PMOS transistor, the transistor is turned on in a case that a signal of a negative voltage is applied to the gate electrode of the transistor and turned off in a case that a signal of a positive voltage is applied to the gate electrode of the transistor.

For example, in order to turn on the third transistor T3 provided as the NMOS transistor, a positive voltage may have to be applied to the third transistor T3, and in order to turn on the fifth and sixth transistors T5 and T6 provided as the PMOS transistor, a negative voltage may have to be applied to the fifth and sixth transistors T5 and T6.

FIG. 9 shows the third scan signal Sn−1 supplied to the third scan line SL3 of the pixel circuit, the fourth scan signal Sn' supplied to the fourth scan line SL4, and the emission control signal En supplied to the emission control line EL during one frame period.

The third scan signal Sn−1 is a signal for controlling the fourth transistor T4, and the fourth scan signal Sn' is a signal for controlling the third transistor T3. The emission control signal En is a signal for controlling the fifth transistor T5 and the sixth transistor T6.

One frame period may be partitioned into first to third sections t1 to t3. The first section t1 may be a period in which the second node N2 electrically connected to the gate electrode of the first transistor T1 and an anode electrode of the organic light-emitting diode OLED may be initialized, the second section t2 may be a period in which a data voltage may be supplied and a threshold voltage of the first transistor T1 may be sensed, and the third section t3 may be a period in which the organic light-emitting diode OLED emits light.

The third scan signal Sn−1 may be generated with a gate-on voltage Von during the first section t1, and the fourth scan signal Sn' may be generated with a gate-on voltage Von during the second section t2. The emission control signal En may be generated with a gate-on voltage Von during the third period t3. The first to third sections t1 to t3 may be each determined appropriately through previous experiments. The gate-on voltage Von may correspond to a turn-on voltage that may turn on the transistor. A gate-off voltage Voff may correspond to a turn-off voltage that may turn off the transistor.

In an embodiment, the third scan signal Sn−1 and the fourth scan signal Sn' may be signals for controlling the third and fourth transistors T3 and T4 that may be provided as the NMOS, and the gate-on voltage Von for turning on the third and fourth transistors T3 and T4 may be positive voltages.

On the other hand, the emission control signal En may be a signal for controlling the fifth and sixth transistors T5 and T6 provided as the PMOS, and the gate-on voltage Von thereof for turning on the fifth and sixth transistors may be a negative voltage.

In the third section t3, in which the organic light-emitting diode OLED emits light, the third and fourth transistors T3 and T4 may be required to be turned off, and thus, the third scan signal Sn−1 and the fourth scan signal Sn' of negative voltages may be supplied.

In the third section t3, the fifth and sixth transistors T5 and T6 may be required to be turned on, and thus, the emission control signal En of negative voltage may be supplied.

Referring to FIG. 10, in which the shielding pattern SHP may not be provided, as a comparative example, negative voltages may be applied to both the fourth scan line SL4 and the emission control line EL that may be at opposite sides of the first transistor T1 during the third section t3 in which the light may be emitted. In this case, positive charges may gather at an interface of the substrate 100, with respect to the fourth scan line SL4 and the emission control line EL. Accordingly, negative charges may gather under or below the semiconductor layer A1 of the first transistor T1, and the first transistor T1 may be affected by the negative charges.

The shielding pattern SHP according to one or more embodiments may be adopted to reduce the influence of the negative charges. Referring to FIG. 8, the shielding pattern SHP may overlap the fourth scan line SL4 at one or a side of the first transistor T1. Also, because the shielding pattern SHP may receive the supply of the first power voltage ELVDD, that is, the positive voltage, during the emission period, negative charges may gather at an interface of the substrate 100 under or below the shielding pattern SHP and positive charges may gather at the interface of the substrate under or below the emission control line EL during the emission period, and thus, an amount of charges that may gather at the interface of the substrate 100, which may correspond to the first transistor T1, may not be large. Accordingly, the influence on the first transistor T1 may be reduced.

In FIGS. 7 and 8, the shielding pattern SHP may be disposed under or below the fourth scan line SL4, but one or more embodiments are not limited thereto. The shielding pattern SHP may overlap the emission control line EL.

Figure 11:
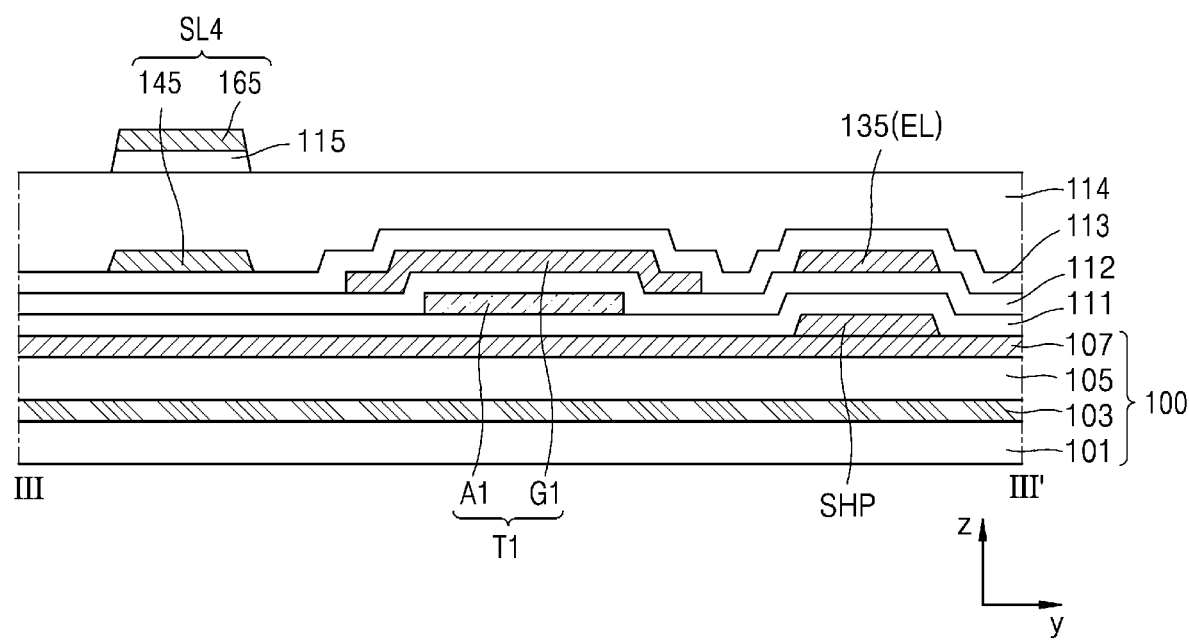
FIG. 11 is a schematic cross-sectional view partially showing a display apparatus according to an embodiment.

FIG. 11 is a schematic cross-sectional view showing a portion of the display apparatus, according to an embodiment. In FIG. 11, like reference numerals denote the same elements as those of FIG. 8.

Referring to FIG. 11, the display apparatus according to an embodiment may include the first transistor T1 including silicon semiconductor, the emission control line EL that may be a first signal line at a side of the first transistor T1, the fourth scan line SL4 that may be a second signal line at the other or another side of the first transistor T1, and the shielding pattern SHP overlapping the emission control line EL.

The shielding pattern SHP may include various conductive materials. For example, the shielding pattern SHP may have a single or multi-layered structure including one or more materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The shielding pattern SHP may extend in the same direction as the direction, in which the emission control line EL may extend, in a plan view. In this case, the shielding pattern SHP may overlap the fifth transistor T5 (see FIG. 3) that may be an operation control transistor and/or the sixth transistor T6 (see FIG. 3) that may be an emission control transistor.

In an embodiment, the shielding pattern SHP may be disposed between the substrate 100 and the buffer layer 111. The shielding pattern SHP may be at a different layer from that of the semiconductor layer A1. The shielding pattern SHP may be electrically connected to a first power voltage line (not shown) via a contact hole to receive application of positive voltage. Accordingly, voltages of different polarities may be applied to the first and second signal lines that may be at opposite sides of the first transistor T1 during an emission period of the display element, and thus, characteristics of the first transistor T1 may be stabilized.

According to an embodiment, the drive circuit for driving the display element may include the first thin film transistor including a silicon semiconductor and the second thin film transistor including an oxide semiconductor, and thus, a high resolution display apparatus having low power consumption may be provided.

Also, according to an embodiment, the shielding pattern overlapping the scan line or the emission control line may be provided, and thus, the display apparatus having improved quality may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate comprising a display area including a display element;
    a first thin film transistor disposed in the display area, the first thin film transistor comprising:
        a first semiconductor layer including a silicon semiconductor; and
        a first gate electrode insulated from the first semiconductor layer;
    a second thin film transistor disposed in the display area, the second thin film transistor comprising:
        a second semiconductor layer including an oxide semiconductor; and
        a second gate electrode insulated from the second semiconductor layer;
    a first signal line extending at a side of the first thin film transistor in a first direction;
    a second signal line extending at an opposite side of the first thin film transistor in the first direction; and
    a shielding pattern extending in the first direction, the shielding pattern at least partially overlapping the first signal line.

2. The display apparatus of claim 1, wherein the shielding pattern and the first semiconductor layer are disposed on a same layer.

3. The display apparatus of claim 1, wherein
    the first thin film transistor comprises a driving transistor and an emission control transistor,
    the second thin film transistor comprises a compensation transistor, the first signal line is electrically connected to a gate electrode of the compensation transistor to transfer a scan signal, and the second signal line is electrically connected to a gate electrode of the emission control transistor to transfer an emission control signal.

4. The display apparatus of claim 1, wherein
the first thin film transistor comprises a driving transistor and a switching transistor,
a semiconductor layer in the driving transistor and a semiconductor layer in the switching transistor are integral with each other, and
the shielding pattern protrudes from a region between the semiconductor layer of the driving transistor and the semiconductor layer of the switching transistor in the first direction in a plan view.

5. The display apparatus of claim 4, wherein
the second thin film transistor comprises a compensation transistor, and
the shielding pattern overlaps a semiconductor layer of the compensation transistor of the second thin film transistor.

6. The display apparatus of claim 1, wherein the shielding pattern receives a positive voltage during an emission period of the display element.

7. The display apparatus of claim 1, wherein the shielding pattern is disposed between the substrate and the first semiconductor layer of the first thin film transistor.

8. The display apparatus of claim 7, wherein
the first thin film transistor comprises a driving transistor and an emission control transistor,
the second thin film transistor comprises a compensation transistor, and
the first signal line includes an emission control line electrically connected to a gate electrode of the emission control transistor to transfer an emission control signal.

9. The display apparatus of claim 1, further comprising:
a first interlayer insulating layer disposed between the first gate electrode and the second thin film transistor;
a second interlayer insulating layer overlapping the second gate electrode of the second thin film transistor;
a first power voltage line disposed on the second interlayer insulating layer, the first power voltage line extending in a second direction intersecting the first direction;
a first planarization layer overlapping the first power voltage line; and
a data line disposed on the first planarization layer, the data line extending in the second direction and at least partially overlapping the first power voltage line.

10. The display apparatus of claim 9, further comprising:
a node connecting line disposed on the second interlayer insulating layer, the node connecting line including:
an end electrically connected to the first gate electrode of the first thin film transistor; and
an opposite end electrically connected to the second semiconductor layer of the second thin film transistor.

11. A display apparatus comprising:
a substrate comprising a display area including a display element;
a driving transistor, a switching transistor, and an emission control transistor disposed in the display area, the driving transistor, the switching transistor, and the emission control transistor each comprising a silicon semiconductor;
a compensation transistor disposed in the display area, the compensation transistor comprising an oxide semiconductor;
a first signal line extending at a side of the driving transistor in a first direction;
a second signal line extending at an opposite side of the driving transistor in the first direction; and
a shielding pattern extending in the first direction, the shielding pattern at least partially overlapping the first signal line.

12. The display apparatus of claim 11, wherein the shielding pattern and a semiconductor layer of the driving transistor are disposed on a same layer.

13. The display apparatus of claim 11, wherein
the first signal line is electrically connected to a gate electrode of the compensation transistor to transfer a scan signal, and
the second signal line is electrically connected to a gate electrode of the emission control transistor to transfer an emission control signal.

14. The display apparatus of claim 11, wherein
a semiconductor layer of the driving transistor and a semiconductor layer of the switching transistor are integral with each other, and
the shielding pattern protrudes from a region between the semiconductor layer of the driving transistor and the semiconductor layer of the switching transistor in the first direction in a plan view.

15. The display apparatus of claim 11, wherein the shielding pattern overlaps a semiconductor layer of the compensation transistor.

16. The display apparatus of claim 11, wherein
the compensation transistor includes an NMOS transistor,
the emission control transistor includes a PMOS transistor, and
the shielding pattern receives a positive voltage during an emission period of the display element.

17. The display apparatus of claim 11, wherein the shielding pattern is disposed between the substrate and the semiconductor layer of the driving transistor.

18. The display apparatus of claim 17, wherein the first signal line includes an emission control line electrically connected to a gate electrode of the emission control transistor to transfer an emission control signal.

19. The display apparatus of claim 11, further comprising:
a first power voltage line extending in a second direction intersecting the first direction;
a first planarization layer overlapping the first power voltage line; and
a data line disposed on the first planarization layer, the data line extending in the second direction and at least partially overlapping the first power voltage line.

20. The display apparatus of claim 19, further comprising:
a second power voltage line disposed on the first planarization layer and electrically connected to the first power voltage line.

* * * * *